(12) United States Patent
Juengling

(10) Patent No.: US 9,331,203 B2
(45) Date of Patent: May 3, 2016

(54) DEVICES WITH CAVITY-DEFINED GATES AND METHODS OF MAKING THE SAME

(71) Applicant: Micron Technology, Inc., Boise, ID (US)

(72) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 14/198,937

(22) Filed: Mar. 6, 2014

(65) Prior Publication Data

US 2014/0183626 A1    Jul. 3, 2014

Related U.S. Application Data

(60) Continuation of application No. 13/028,064, filed on Feb. 15, 2011, now Pat. No. 8,669,159, which is a division of application No. 12/043,813, filed on Mar. 6, 2008, now Pat. No. 7,915,659.

(51) Int. Cl.
*H01L 29/66* (2006.01)
*H01L 29/78* (2006.01)

(52) U.S. Cl.
CPC ...... *H01L 29/7856* (2013.01); *H01L 29/66545* (2013.01); *H01L 29/66795* (2013.01); *H01L 29/7827* (2013.01); *H01L 29/7851* (2013.01)

(58) Field of Classification Search
CPC ............ H01L 27/0886; H01L 29/7855; H01L 21/823431; H01L 29/7856
USPC .................................................. 257/E29.13
See application file for complete search history.

(56) References Cited

U.S. PATENT DOCUMENTS

| | | |
|---|---|---|
| 3,885,861 A | 5/1975 | Farnsworth et al. |
| 5,160,987 A | 11/1992 | Pricer et al. |
| 5,196,910 A | 3/1993 | Moriuchi et al. |
| 5,661,061 A | 8/1997 | Usuami et al. |
| 5,821,513 A | 10/1998 | O'Hagan et al. |
| 5,858,829 A | 1/1999 | Chen |
| 5,925,918 A | 7/1999 | Wu et al. |
| 5,949,057 A | 9/1999 | Feng |
| 6,008,513 A | 12/1999 | Chen |
| 6,043,562 A | 3/2000 | Keeth |
| 6,081,008 A | 6/2000 | Rostoker |

(Continued)

FOREIGN PATENT DOCUMENTS

| | | |
|---|---|---|
| DE | 19946719 | 4/2001 |
| JP | 2006054431 | 2/2006 |

(Continued)

OTHER PUBLICATIONS

Betty Prince, Ph.D.; "Trends in Scaled and Nanotechnology Memories"; Memory Strategies International; Leander, Texas; 2005.
Branislav Curanovic; "Development of a Fully-Depleted Thin-Body FinFET Process"; Department of Microelectronic Engineering, College of Engineering; Rochester Institute of Technology; Rochest, New York; Nov. 2003.

(Continued)

*Primary Examiner* — Daniel Luke
(74) *Attorney, Agent, or Firm* — Fletcher Yoder, P.C.

(57) ABSTRACT

Disclosed are methods, systems and devices, including a method that includes the acts of forming a semiconductor fin, forming a sacrificial material adjacent the semiconductor fin, covering the sacrificial material with a dielectric material, forming a cavity by removing the sacrificial material from under the dielectric material, and forming a gate in the cavity.

22 Claims, 24 Drawing Sheets

(56) References Cited

U.S. PATENT DOCUMENTS

| | | | |
|---|---|---|---|
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,432,769 B1 | 8/2002 | Fukuda et al. | |
| 6,440,792 B1 | 8/2002 | Shaio et al. | |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,091,543 B2 | 8/2006 | Tzeng et al. | |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,190,060 B1 | 3/2007 | Chiang | |
| 7,195,995 B2 | 3/2007 | Mouli | |
| 7,205,606 B2 | 4/2007 | Tran | |
| 7,345,937 B2 | 3/2008 | Yoon et al. | |
| 7,742,324 B2 | 6/2010 | Juengling | |
| 7,808,042 B2 | 10/2010 | Juengling | |
| 7,898,857 B2 | 3/2011 | Kirsch et al. | |
| 7,969,776 B2 | 6/2011 | Juengling | |
| 8,076,229 B2 | 12/2011 | Juengling | |
| 8,546,876 B2 | 10/2013 | Juengling | |
| 2001/0003034 A1 | 6/2001 | Furukawa et al. | |
| 2002/0155656 A1 | 10/2002 | Hayano et al. | |
| 2003/0168676 A1 | 9/2003 | Itabashi et al. | |
| 2003/0198073 A1 | 10/2003 | Keeth | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0125636 A1 | 7/2004 | Kurjanowicz et al. | |
| 2004/0202027 A1 | 10/2004 | Kuzmenka et al. | |
| 2005/0133852 A1 | 6/2005 | Shau | |
| 2005/0151206 A1 | 7/2005 | von Schwerin | |
| 2005/0196918 A1 | 9/2005 | von Schwerin | |
| 2005/0245024 A1 | 11/2005 | von Schwerin | |
| 2006/0006446 A1 | 1/2006 | von Schwerin | |
| 2006/0057814 A1 | 3/2006 | Weis | |
| 2006/0073662 A1 | 4/2006 | Jang et al. | |
| 2006/0076602 A1 | 4/2006 | Harter et al. | |
| 2006/0131651 A1 | 6/2006 | Sato et al. | |
| 2006/0244106 A1 | 11/2006 | Morikado | |
| 2006/0246607 A1 | 11/2006 | Fazan et al. | |
| 2006/0246671 A1* | 11/2006 | Jang et al. | 438/294 |
| 2006/0270151 A1 | 11/2006 | Lee | |
| 2006/0273415 A1 | 12/2006 | Kim | |
| 2006/0281250 A1 | 12/2006 | Schloesser | |
| 2007/0010058 A1 | 1/2007 | Juengling | |
| 2007/0023805 A1 | 2/2007 | Wells et al. | |
| 2007/0052040 A1 | 3/2007 | von Schwerin | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0262375 A1 | 11/2007 | Juengling | |
| 2008/0048262 A1* | 2/2008 | Lee et al. | 257/347 |
| 2008/0096355 A1* | 4/2008 | Jang et al. | 438/283 |
| 2009/0111254 A1* | 4/2009 | Yang et al. | 438/587 |
| 2009/0206400 A1 | 8/2009 | Juengling | |
| 2009/0206443 A1 | 8/2009 | Juengling | |

FOREIGN PATENT DOCUMENTS

| | | |
|---|---|---|
| KR | 930005234 | 6/1993 |
| KR | 20020018071 | 3/2002 |
| TW | 380316 | 1/2000 |
| TW | 388125 | 4/2000 |
| WO | WO9728532 | 8/1997 |
| WO | WO0161738 | 8/2001 |
| WO | WO 0231878 | 4/2002 |
| WO | WO0249100 | 6/2002 |
| WO | WO2004/038770 | 5/2004 |

OTHER PUBLICATIONS

Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.

Enrico Gili; ""Fabrication of Vertical MOSFETs With Reduced Parasitics and Suppression of Short Channel Effects""; Department of Electronics and Compter Science, Microelectronics Group; University of Southampton, Jun. 2004http://66.102.1.104/scholar?hl=en&lr=&q=cache:BErKI49qg2MJ;www.ecs.soton.ac.uk/~eg02r/Publications/MinithesisEGili.pdf+dram+fins+%22process+flow%22+%22vertical+access%22".

F. Fishburn, et al.; "A 78nm 6F2 DRAM Technology for Multigigabit Densities".

J. Sturm, et al.; "Increased Transconductance in Fully-Depleted Ultra-Thin Sillicon-on-Insulator MOSFETs"; 6 pages.

R. Katsumata, et al.; "Fin-Array-FET on bulk silicon for sub-100 nm Trench Capacitor DRAM"; 2003 Symposium on VLSI Technology Digest of Technical Papers; Jun. 2003, pp. 61-62http://ieeexplore.iee.org/xpl/freeabs_all.jsp?arnumber=1221086".

T. Park, et al.; "Fabrication of Body-Tied FinFETs (Oega MOSFETs) Using Bulk Si Wafers"; 2003 Sympsoium on VLSI Technology Digest of Technical Papers; Jun. 2003, 2 pages.

J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique". IEEE International Solid-State Circuits Conference, ISSCC 2004 / Session 2 / Non-Volatile Memory / 2.2, 2004.

Bor-Wen Chan, Min-Hwa Chi, Liou, Y.H; Notch Elimination in Polycide Gate Stack Etching for Advanced DRAM Technology; Center for Technol. Dev., Woridwide Semicond. Manuf. Corp., Hsinchu; http://ieeexplore.ieee.org/xpl/freeabs_all.jsp?tp=&arnumber=883094&isnumber=19090.

Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.

Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.

Endoh, T., Shinmei, K., Sakuraba, H., Masuoka, F.; New Three-Dimensional Memory Array Architecture for Future Ultrahigh-Density DRAM; Res. Inst. Of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

* cited by examiner

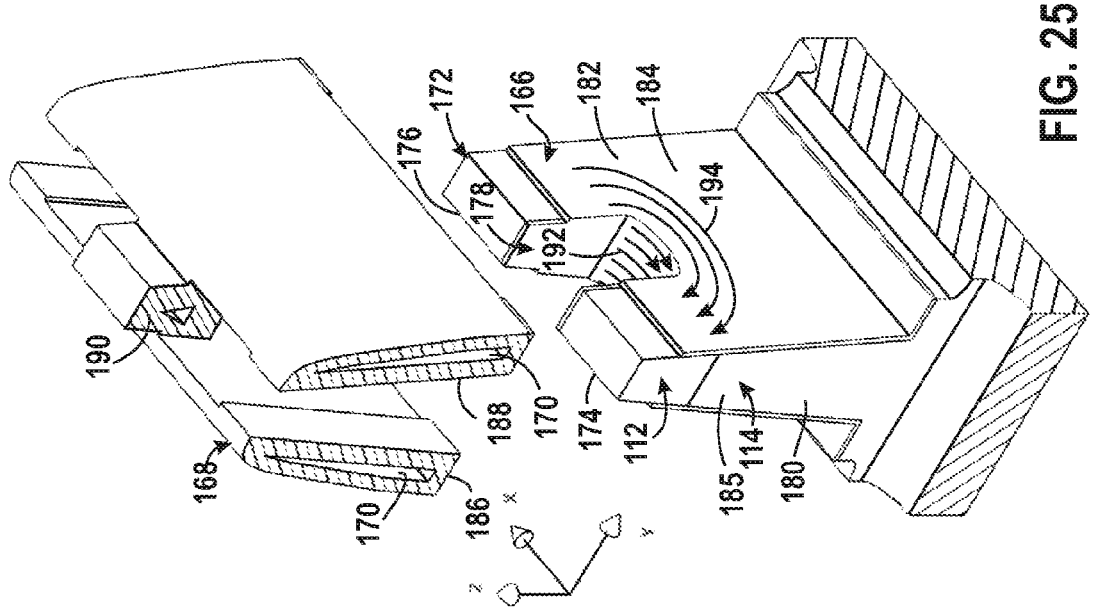
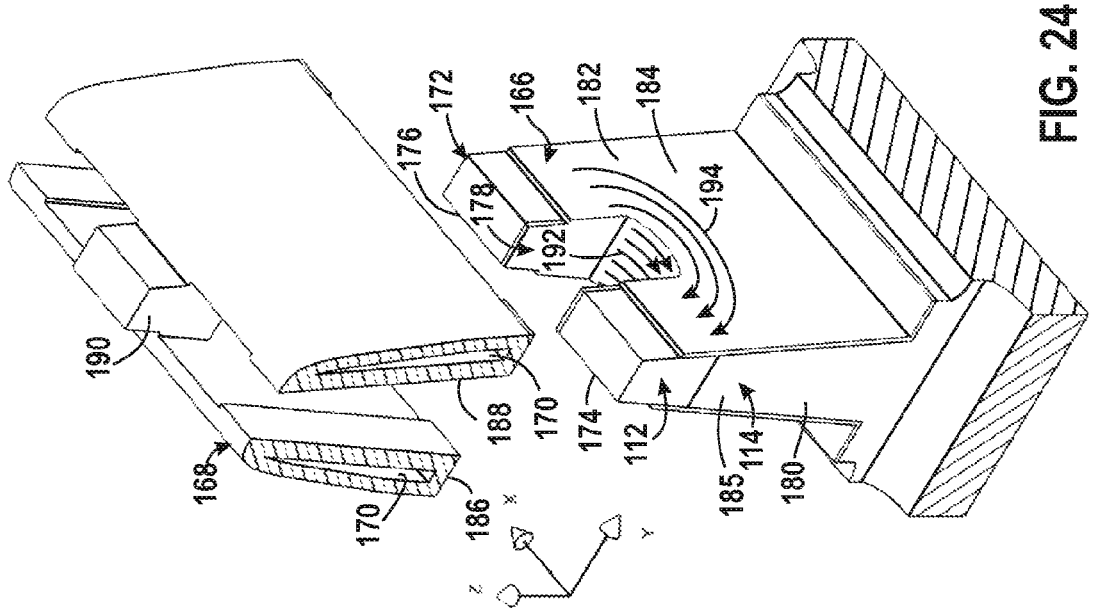

DEVICES WITH CAVITY-DEFINED GATES
AND METHODS OF MAKING THE SAME

CROSS-REFERENCE TO RELATED
APPLICATION

This application is a continuation of U.S. application Ser. No. 13/028,064, which was filed on Feb. 15, 2011, which is a divisional of U.S. patent application Ser. No. 12/043,813, which was filed on Mar. 6, 2008, now U.S. Pat. No. 7,915,659, which issued on Mar. 29, 2011.

BACKGROUND

1. Field of Invention

Embodiments of the present invention relate generally to electronic devices and, more specifically, in certain embodiments, to fin field-effect transistors.

2. Description of Related Art

Fin field-effect transistors (finFETs) are often built around a fin (e.g., a tall, thin semiconductive member) rising generally perpendicularly from a substrate. Typically, a gate traverses the fin by conformally running up one side of the fin, over the top, and down the other side of the fin. In some instances, the gate is disposed against the sides of the fin and does not extend over the top. Generally, a source and a drain are located on opposite sides of the gate near the ends of the fin. In operation, a current through the fin between the source and drain is controlled by selectively energizing the gate.

Some finFETs include gates formed with a sidewall-spacer process. In some versions of this process, the gates are formed by covering a fin with a conformal, conductive film and, then, anisotropically etching the conductive film. During the etch, the conductive material is removed faster from the horizontal surfaces than from the vertical surfaces. As a result, a portion of the conductive material remains against the vertical sidewalls of the fins, thereby forming the gate. An advantage of this process is that relatively narrow gates can be formed relative to gates patterned with photolithography, which is often subject to alignment and resolution constraints.

Although forming gates with a sidewall-spacer process avoids some process issues, it can introduce other failure mechanisms. Often the sidewalls of the fins are angled rather than vertical because the fins were formed with an etch step that was less than perfectly anisotropic. These angled sidewalls can narrow, and in some cases close, the process window for the sidewall spacer process. The angles place the bases of adjacent fins closer to one another, and when the conformal film is deposited in this narrower gap, the portions of the film covering the adjacent sidewalls can join, creating a film with a larger vertical thickness in the gap. The film can become so thick in the gap that the sidewall-spacer etch does not remove all of the conductive film between adjacent gates. The resulting conductive residue forms stringers that short adjacent finFETs and lower yields.

BRIEF DESCRIPTION OF DRAWINGS

FIGS. 1-25 illustrate an example of a manufacturing process in accordance with an embodiment of the present technique.

DETAILED DESCRIPTION

Some of the problems discussed above may be mitigated by certain embodiments of a new manufacturing process. In one embodiment described below, gates are formed in insulated caverns along the sides of fins. The caverns of this embodiment are constructed by forming a carbon mold in the shape of the gates, covering the carbon mold with an insulator, and then removing the carbon mold from under the insulator by combusting the mold. The resulting cavities are then at least partially filled with a gate insulator and a conductive gate material to form transistors. Because the cavities are insulated from one another before the gates are formed, the gates are believed to be less likely to short to other gates. This process and others are described below with reference to FIGS. 1-24.

Figure 1:
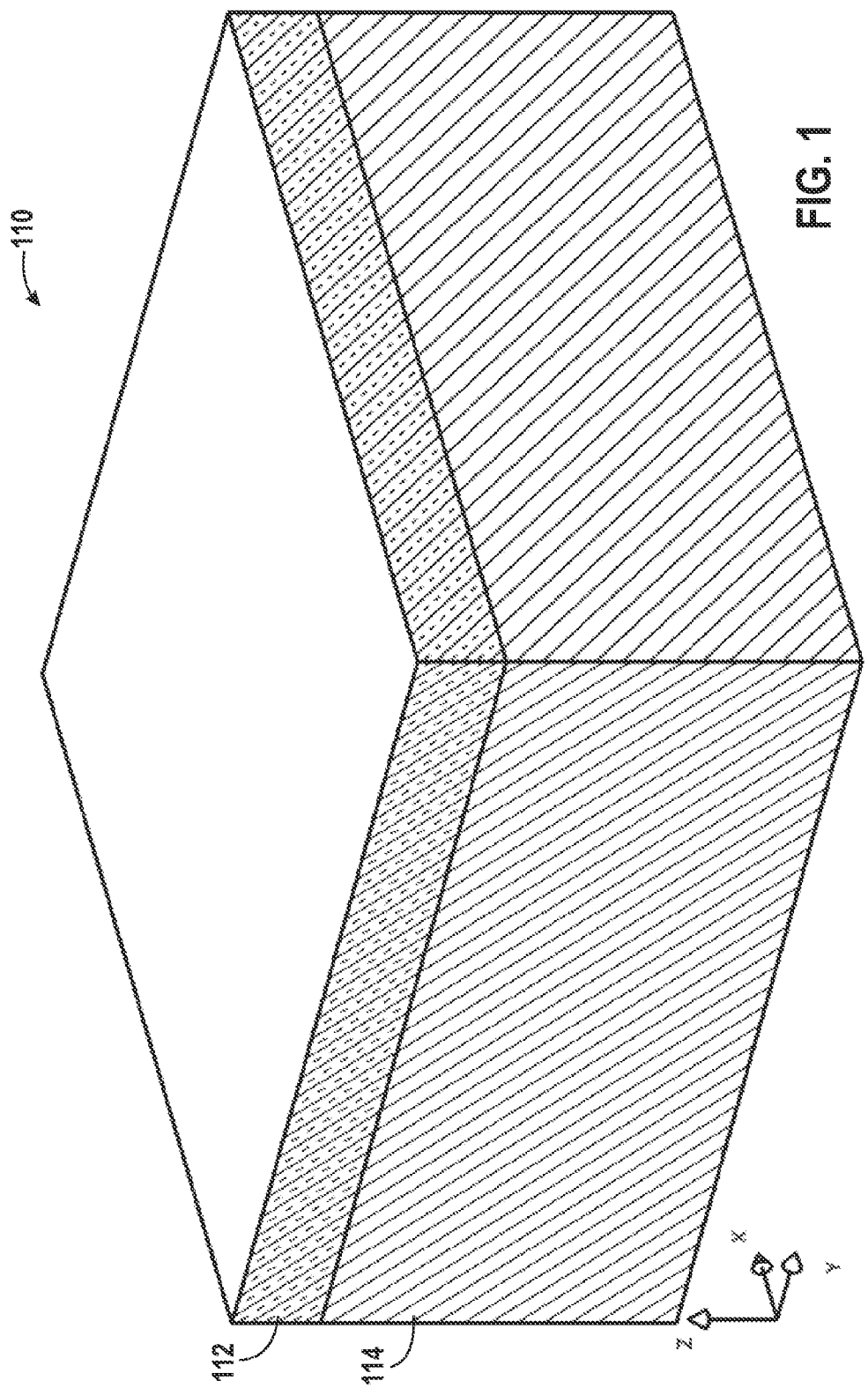

As illustrated by FIG. 1, the manufacturing process begins with providing a substrate 110. The substrate 110 may include semiconductive materials such as single crystal or poly-crystalline silicon, gallium arsenide, indium phosphide, or other materials with semiconductor properties. Alternately, or additionally, the substrate 110 may include a non-semiconductor surface on which an electronic device may be constructed such as a plastic or ceramic work surface, for example. The term "substrate" encompasses bodies in a variety of stages of manufacture, including an unprocessed whole wafer, a partially-processed whole wafer, a fully-processed whole wafer, a portion of a diced wafer, or a portion of a diced wafer in a packaged electronic device.

In this embodiment, the substrate 110 includes an upper doped region 112 and a lower doped region 114. The upper doped region 112 and the lower doped region 114 may be differently doped. For example, the upper doped region 112 may include an n+ material and the lower doped region 114 may include a p− material. The depth of the upper doped region 112 may be generally uniform over a substantial portion of the substrate 110, such as throughout a substantial portion of an array area of a memory device, for example. The upper doped region 112 and lower doped region 114 may be formed by implanting or diffusing dopant materials. Alternatively, or additionally, one or both of these regions 112 and/or 114 may be doped during growth or deposition of all or part of the substrate 110, such as during epitaxial deposition of a semiconductive material or during growth of a semiconductive ingot from which wafers may be cut. As explained below, the upper doped region 112 may provide material used to form a source and a drain of a transistor, and the lower doped region 114 may provide material used to form a channel of the transistor.

Figure 2:
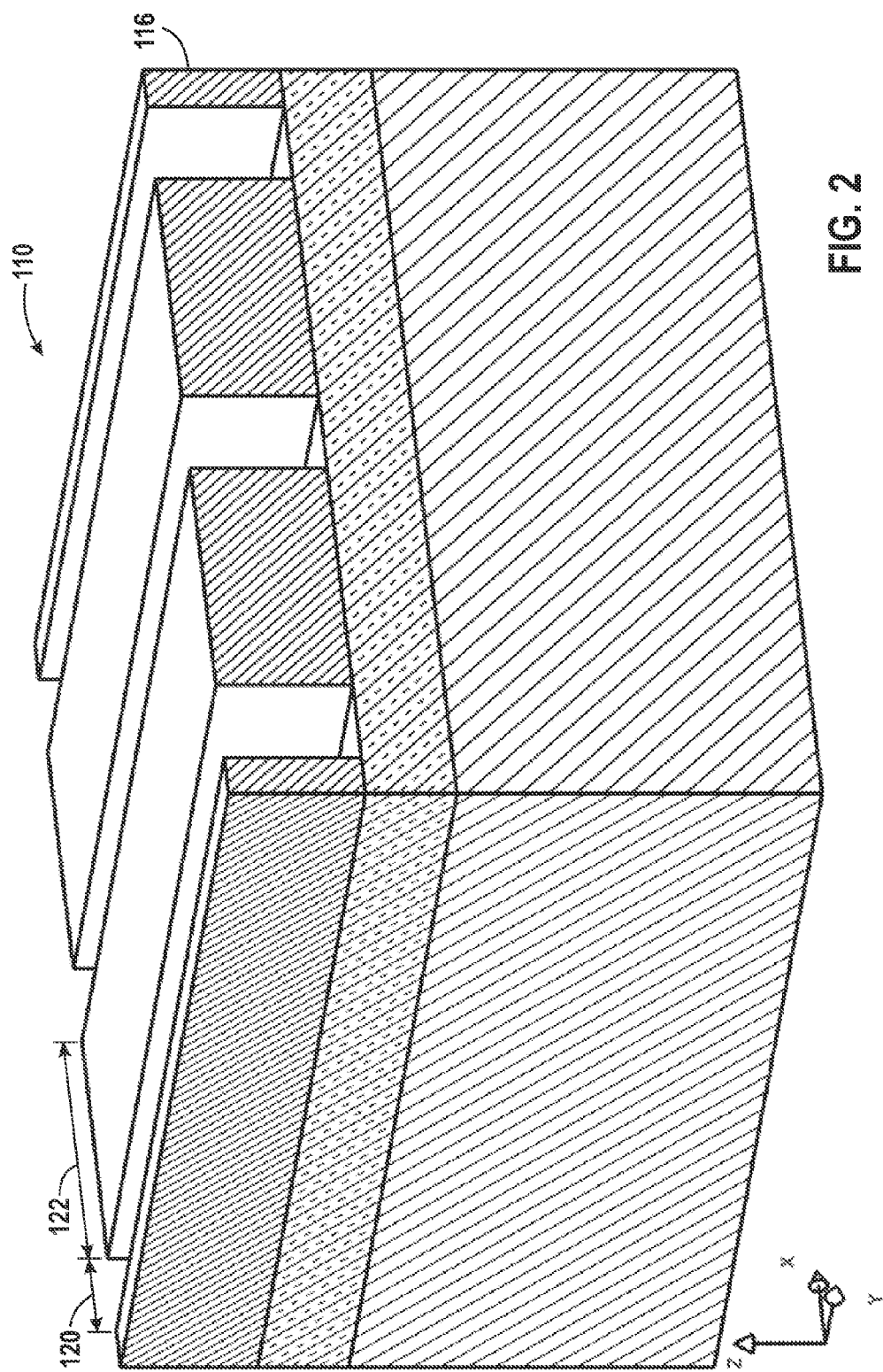
Figure 3:
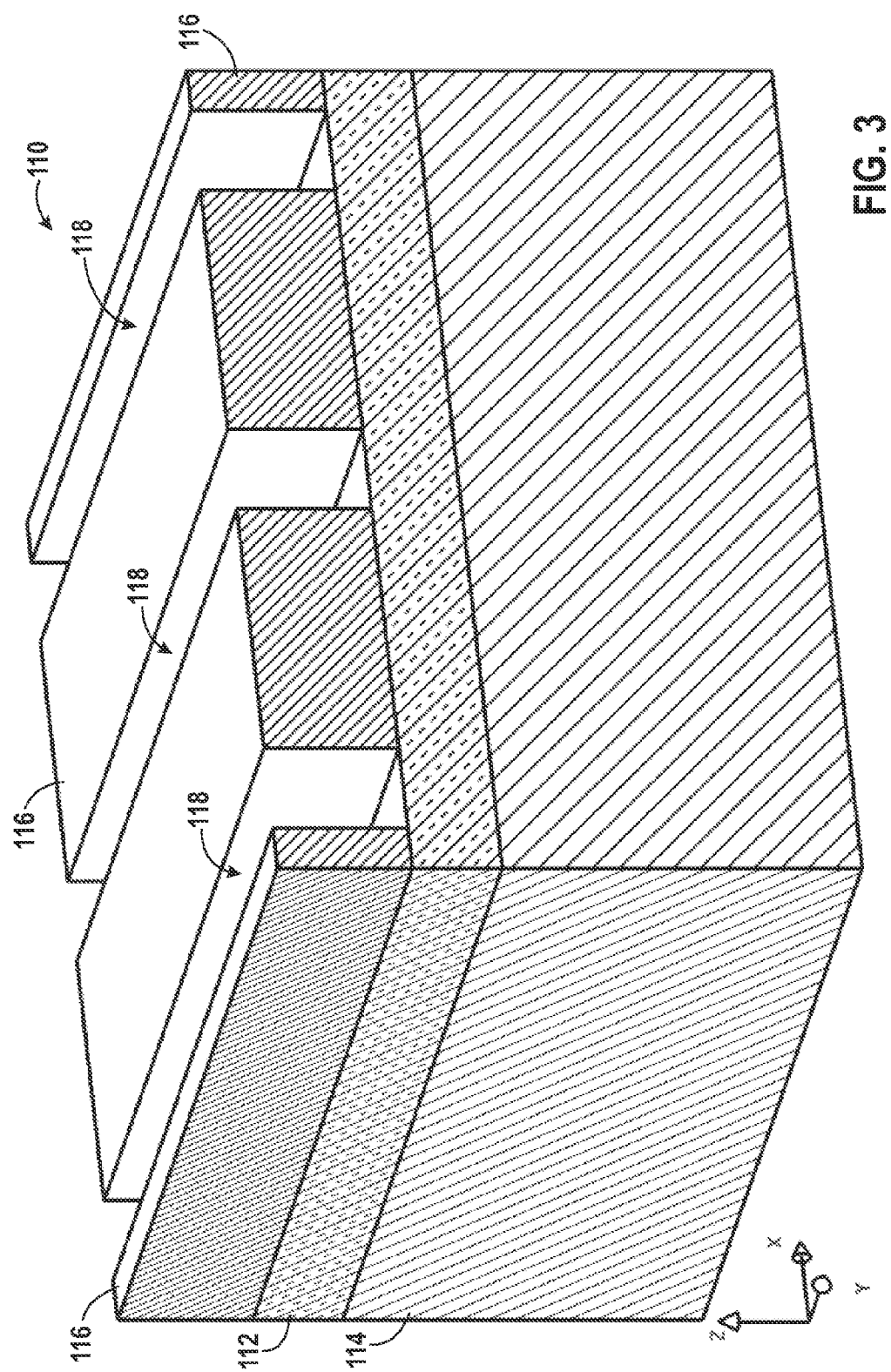

Next, a deep trench mask 116 is formed, as illustrated by FIG. 2, and deep isolation trenches 118 are etched, as illustrated by FIG. 3. The deep trench mask 116 may be photoresist or a hard mask, and the deep trench mask 116 may be patterned with photolithography equipment or other types of lithographic equipment, such as a nano-imprint system or an electron beam system. The deep trench mask 116 includes generally linear and generally parallel exposed regions with a width 120 generally equal to or less than ¼ F, ½ F or F and masked regions with a width 122 generally equal to or less than ¾ F, ½ F, or 3 F, where F is the resolution of the system used to pattern the deep trench mask 116.

In some embodiments, the deep trench mask 116 is formed by double pitching a mask (not shown). In one example of such a process, the deep trench mask 116 is formed first by masking off the areas between every other pair of exposed regions and, then, forming a poly-silicon sidewall spacer on the sides of the mask, over the areas corresponding to each of the exposed regions. Then the initial mask may be removed and a hard mask material, such as oxide, may be deposited over the remaining poly-silicon sidewall spacers, and the hard mask material may be etched back or planarized with chemical mechanical planarization (CMP) to expose the poly-silicon. Next, the poly-silicon may be selectively etched to form the exposed regions the oxide hard mask illustrated by FIG. 2. Because the width 122 of the exposed regions is generally defined by the width of a sidewall spacer, in some embodiments, the width 122 may be smaller than F.

As illustrated by FIG. 3, the regions of the substrate 110 exposed by the mask 116 may be etched to form the deep isolation trenches 118. In this embodiment, the etch is a generally anisotropic dry etch. The deep isolation trenches 118 may generally extend laterally in the Y direction and downward in the Z direction. The deep isolation trenches 118 may have a generally rectangular or trapezoidal cross-section, and, in some embodiments, their cross-section may be generally uniform through some distance in the Y-direction.

Figure 4:
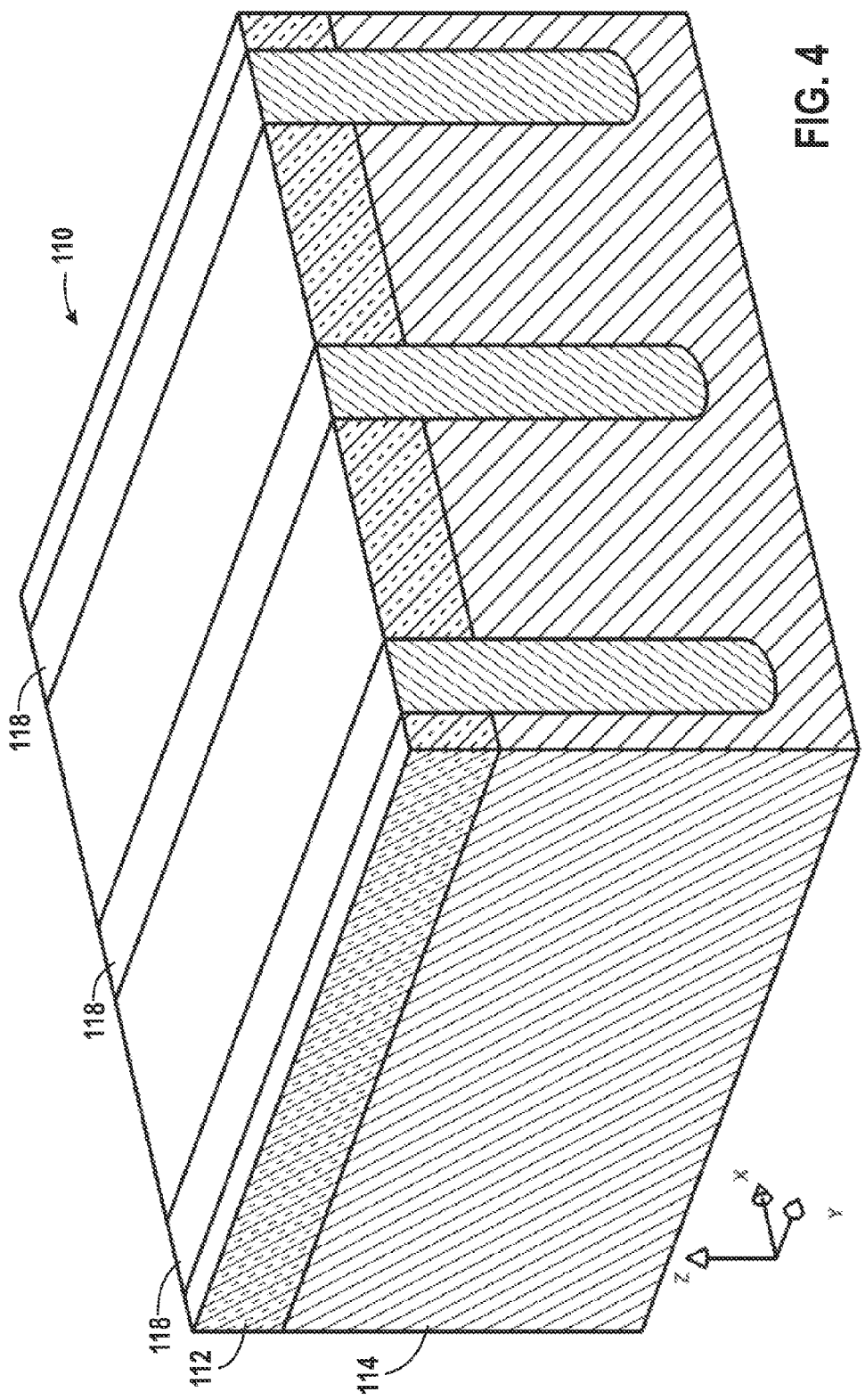

Next in the present embodiment, the deep trench mask 116 is removed, and the deep isolation trenches 118 are filled with a dielectric, as illustrated by FIG. 4. The deep trench mask 116 may be removed with a variety of techniques, such as reacting photoresist with oxygen in a furnace or in a plasma etch chamber or selectively wet etching the mask material. In some embodiments, the deep trench mask 116 is removed after filling the deep isolation trenches 118. In others, deep trench mask 116 may be removed prior to filing the deep isolation trenches 118. For example, a dielectric overburden may be deposited both over the deep trench mask 116 and in the deep isolation trenches 118, and the deep trench mask 116 may serve as a stop region during chemical-mechanical planarization (CMP) to remove the overburden. The deep isolation trenches 118 may be partially or entirely filled with various dielectric materials, such as high-density-plasma (HDP) oxide, spun-on-glass (SOG), or tetra-ethyl-ortho-silicate (TEOS), among others, to electrically isolate features. To further isolate features, in some embodiments, the bottom of the deep isolation trenches 118 may be implanted with a dopant selected to enhance isolation prior to filling the trenches 118. Additionally, the deep isolation trenches 118 may include various liner materials, such as silicon nitride for example, to relieve film stresses, improve adhesion, or function as a barrier material.

Figure 5:
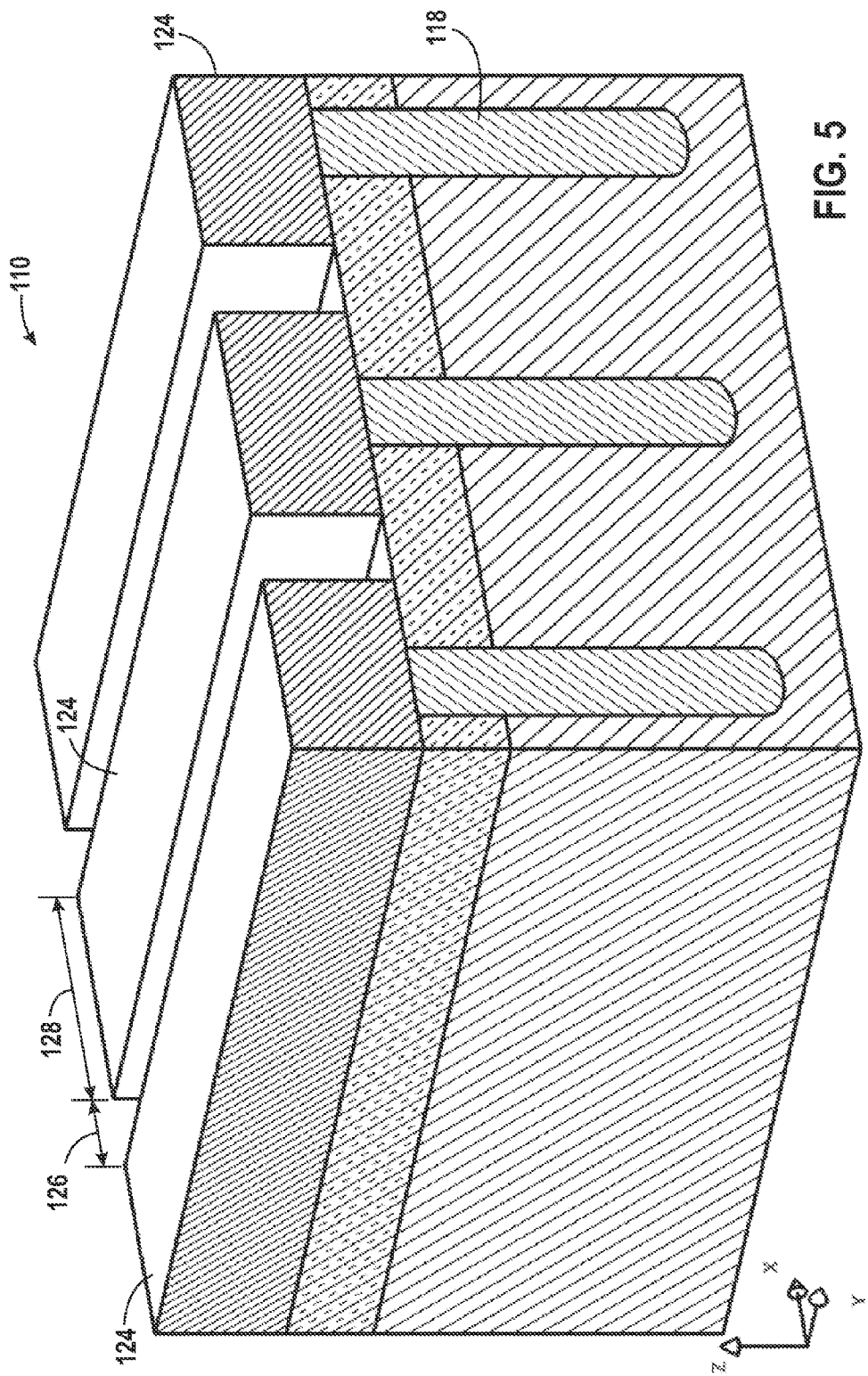

After filling the deep isolation trenches 118, a shallow trench mask 124 is formed on the substrate 110, as illustrated by FIG. 5. As with the deep trench mask 116, the shallow trench mask 124 may be photoresist or a hard mask, and it may be patterned with various lithographic systems, such as those discussed above. In some embodiments, the shallow trench mask 124 is a hard mask formed with a double-pitched-mask process similar to the process described above for the isolation trench mask 116, except that this mask is shifted in the X direction by ½ pitch. The illustrated shallow trench mask 124 includes exposed regions with a space 126 that may have a width generally equal to or less than ¼ F, ½ F or F and covered regions with a width 128 that may be generally equal to or less than ¾ F, ½ F, or 3 F. The exposed regions may be generally linear, generally parallel, and interposed generally equidistant between the deep isolation trenches 118.

Figure 6:
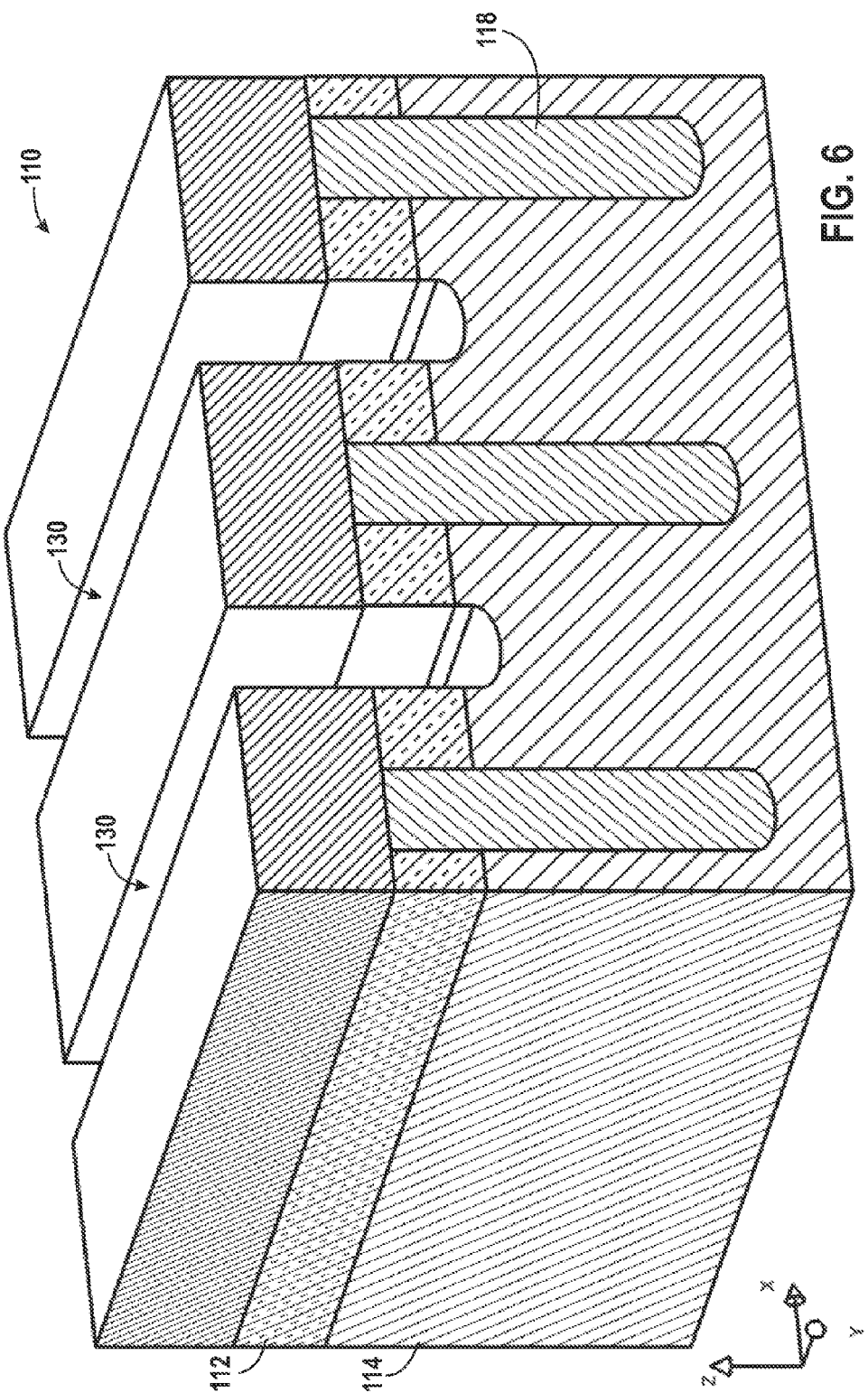

Next, the exposed regions of the substrate 110 may be etched to form shallow trenches 130, as illustrated by FIG. 6. The shallow trenches 130 may be generally linear, generally parallel, generally extend generally laterally in the Y direction and generally downward in the Z direction, and thus, may be generally parallel to the deep isolation trenches 118. In this embodiment, the shallow trenches 130 are formed with a generally anisotropic dry etch and are deeper than the upper doped region 112, but not as deep as the deep isolation trenches 118. The shallow trenches 130 may have a generally rectangular or generally trapezoidal profile that is generally uniform in the Y direction over a substantial distance.

Figure 7:
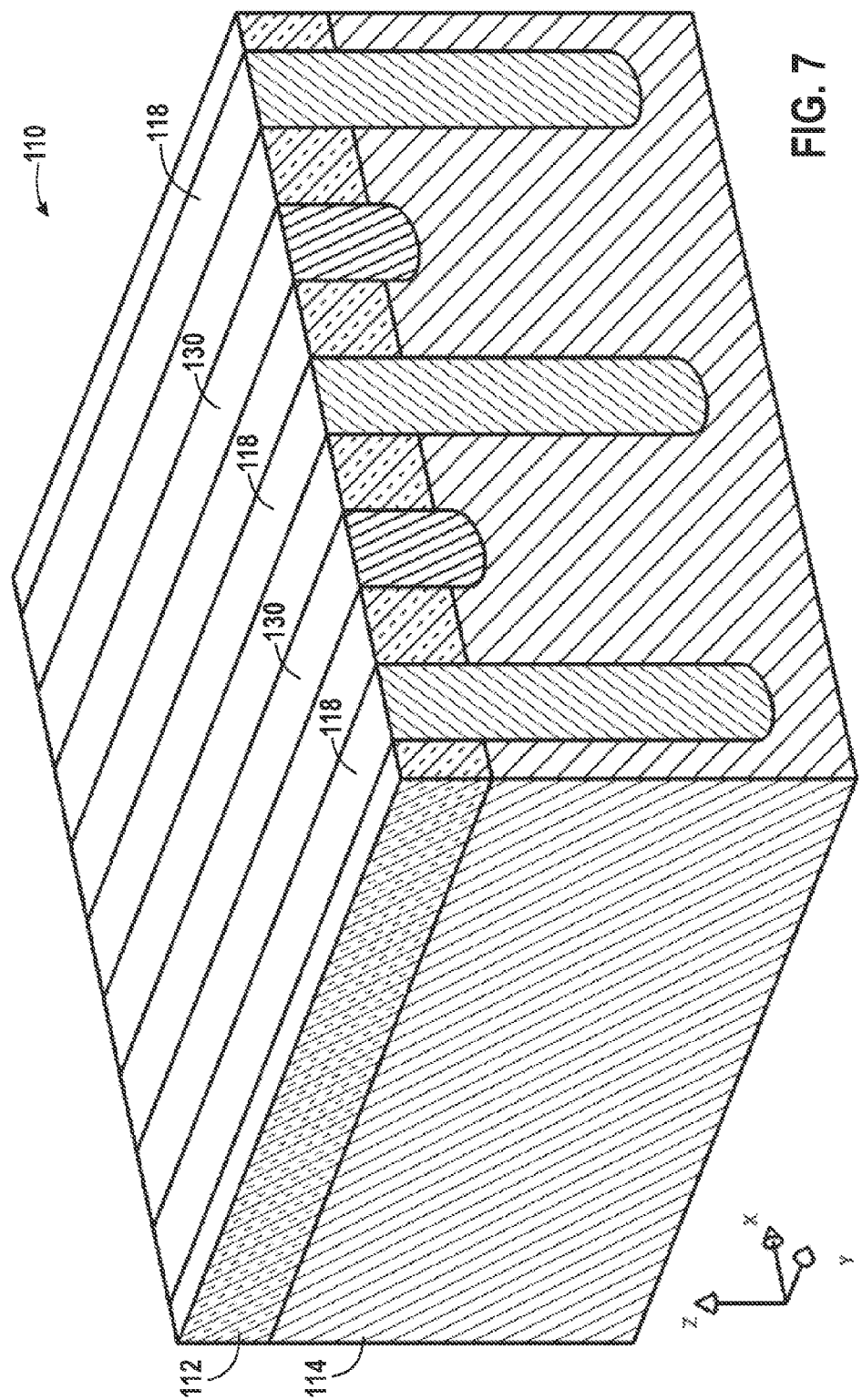

As illustrated by FIG. 7, the shallow trenches 130 are filled with a sacrificial material, such as nitride. In this embodiment, the shallow trenches 130 are filled with a different material from the deep isolation trenches 118 so that the shallow trenches 130 can be selectively etched in a subsequent step without removing substantial amounts of material from the deep isolation trenches 118. In other embodiments though, these trenches 118 and 130 may include the same material.

Figure 8:
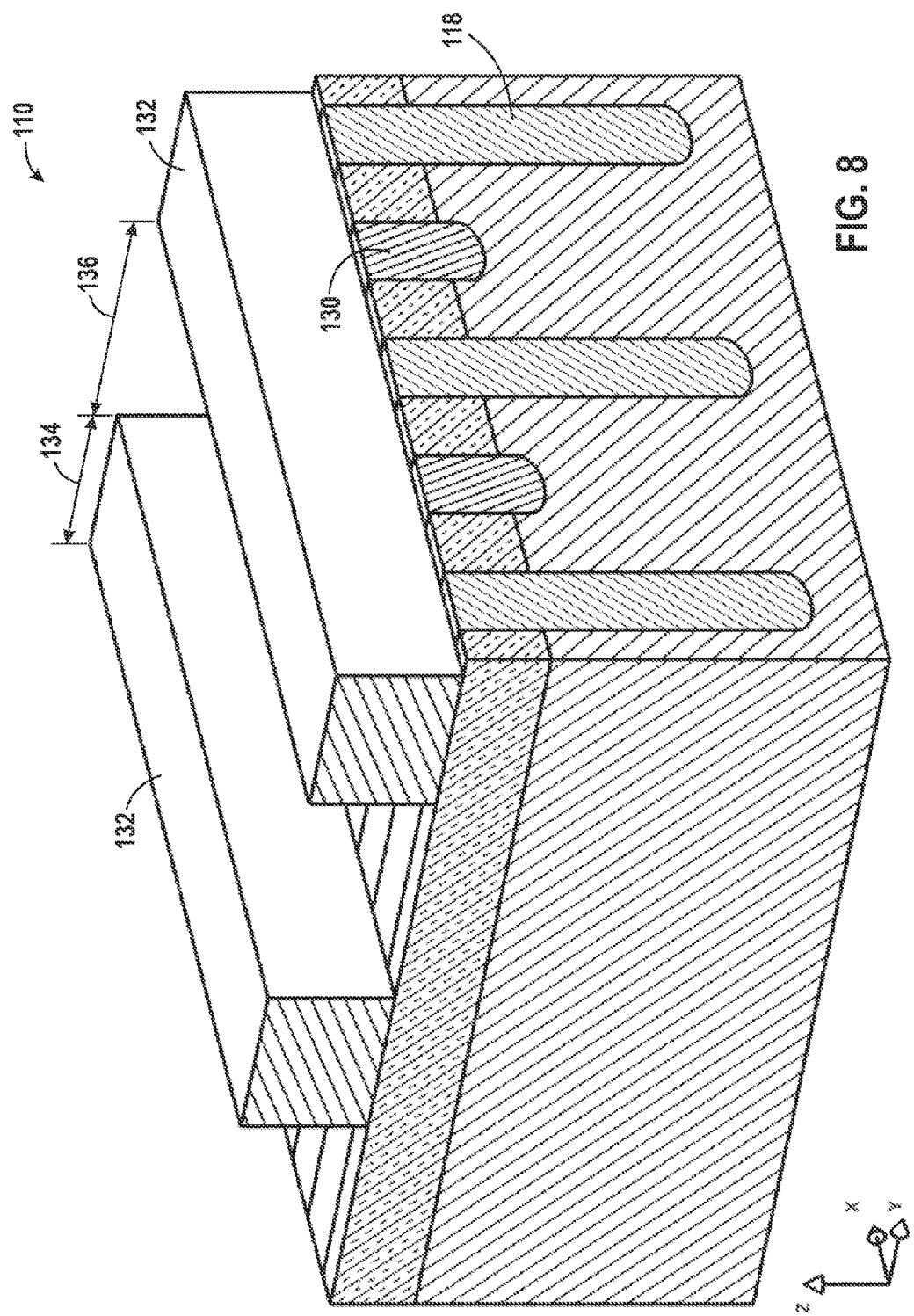

Next, a fin mask 132 is formed, as illustrated by FIG. 8. The fin mask 132 may be made of photoresist, or it may be a hard mask. The fin mask 132 may be patterned with any of the lithographic systems described above or others. In this embodiment, the fin mask 132 defines a masked region with a width 134 and exposed regions with a width 136. The width 134 may be generally equal to or less than F, and the width 136 may be generally equal to or less than ½ F. The masked regions may be generally straight, generally parallel to one another, and are generally perpendicular to both the deep isolation trenches 118 and the shallow trenches 130, and generally extend in the X direction.

Figure 9:
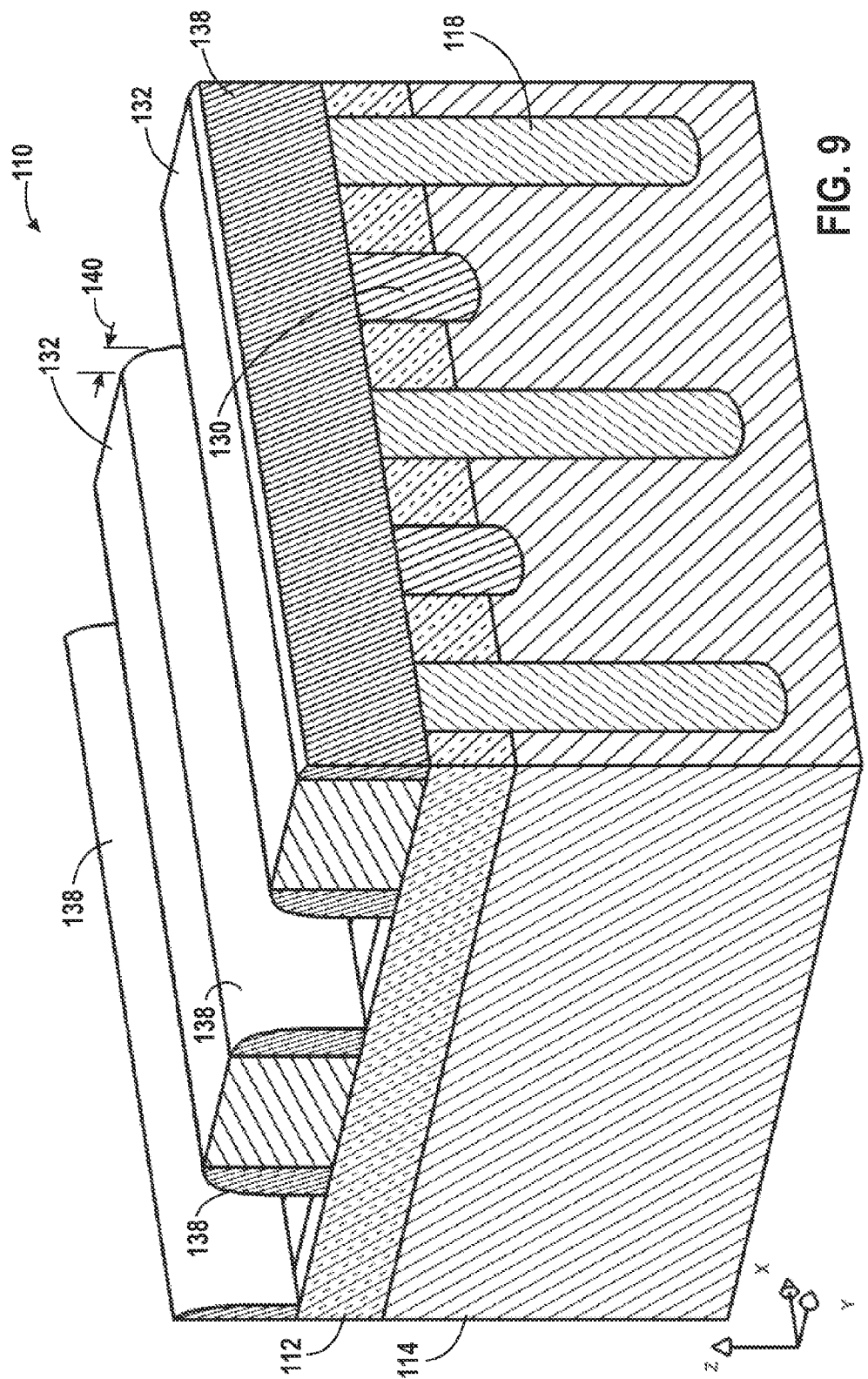

In some embodiments, the fin mask 132 is double pitched. Sidewall spacers 138 may be formed against the sidewalls of the fin mask 132, as illustrated by FIG. 9. The sidewall spacers 138 may be formed by depositing a conformal film on the substrate 110 and anisotropic ally etching the conformal film to remove it from the horizontal surfaces. The sidewall spacers 138 may be made of a different material from the fin mask 132 to facilitate selective removal of the fin mask 132 in a subsequent step. The sidewall spacers 138 may have a width 140 that is generally equal to or less than ¼ F, ½ F, or F.

Figure 10:
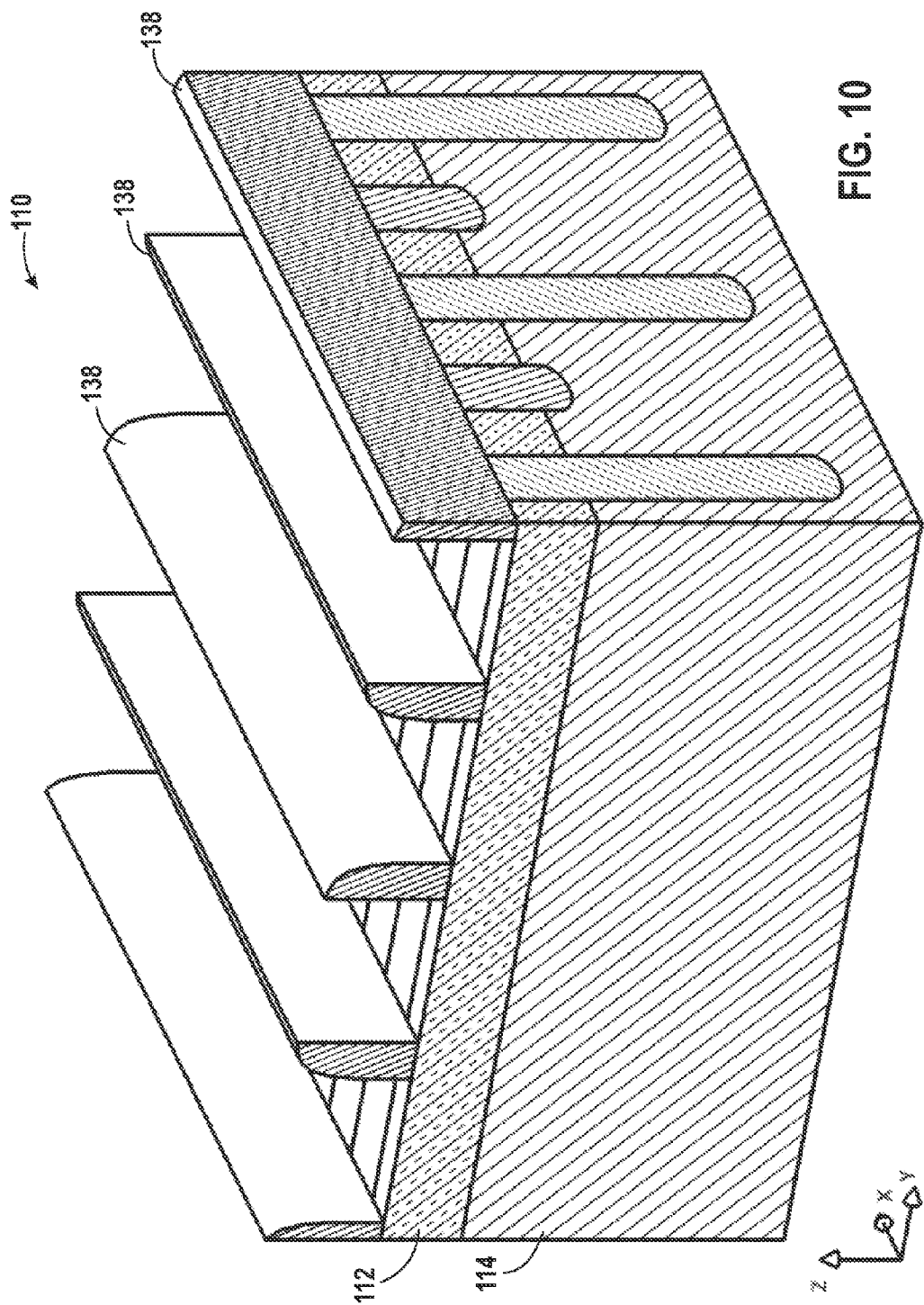
Figure 11:
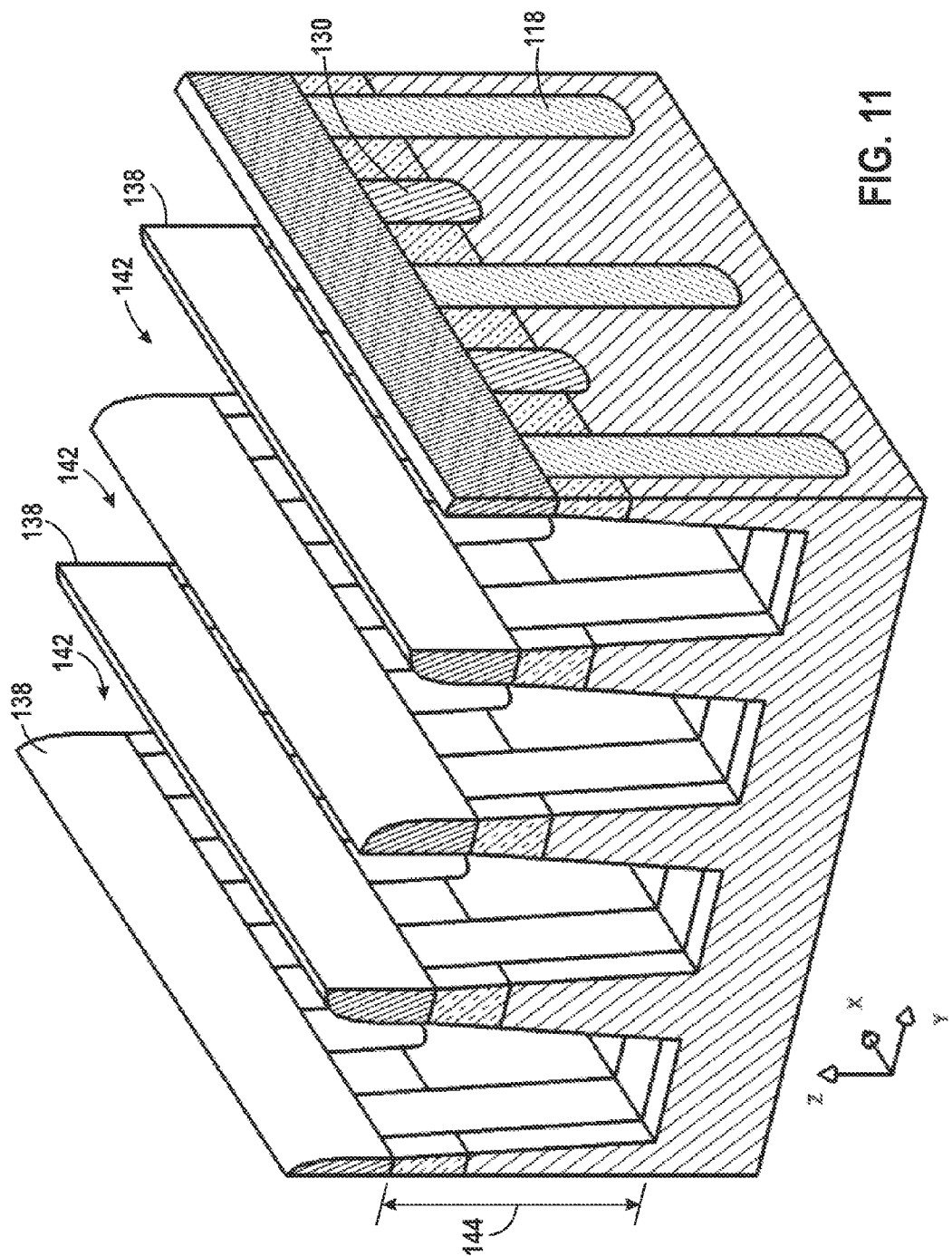

Next, the fin mask 132 is removed, as illustrated by FIG. 10, and fin rows 142 are formed, as illustrated by FIG. 11. The fin mask 132 may be removed with an etch or other process that selectively removes the fin mask material at a substantially higher rate than the other materials of the substrate 110. Each of the exposed sidewall spacers 138 may mask an area that generally corresponds with the top of the fin rows 142. In this embodiment, the fin rows 142 are etched with a generally anisotropic etch to a depth 144 that is generally greater than the depth of the shallow trenches 130, but not as deep as the deep isolation trenches 118. The fin rows 142 may have a generally trapezoidal cross-section that extends generally uniformly in the X direction over a substantial distance. In other embodiments, the fin rows 142 may have other profiles, such as generally rectangular or curved profiles.

Figure 12:
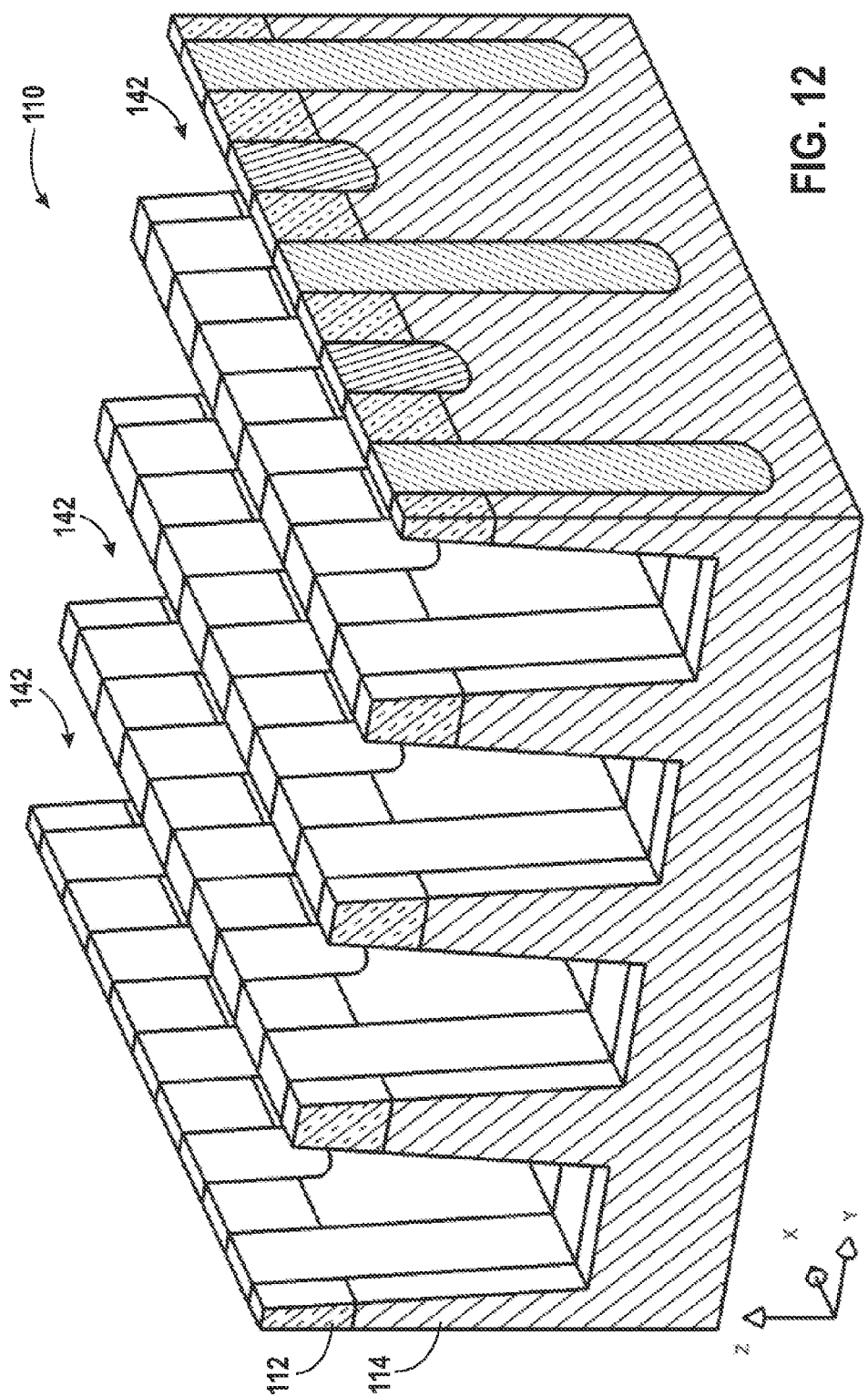

Next, the spacers 138 may be removed, as illustrated by FIG. 12, or in some embodiments, the spacers 138 may be left on the fin rows 142 and removed during a subsequent step.

Figure 13:
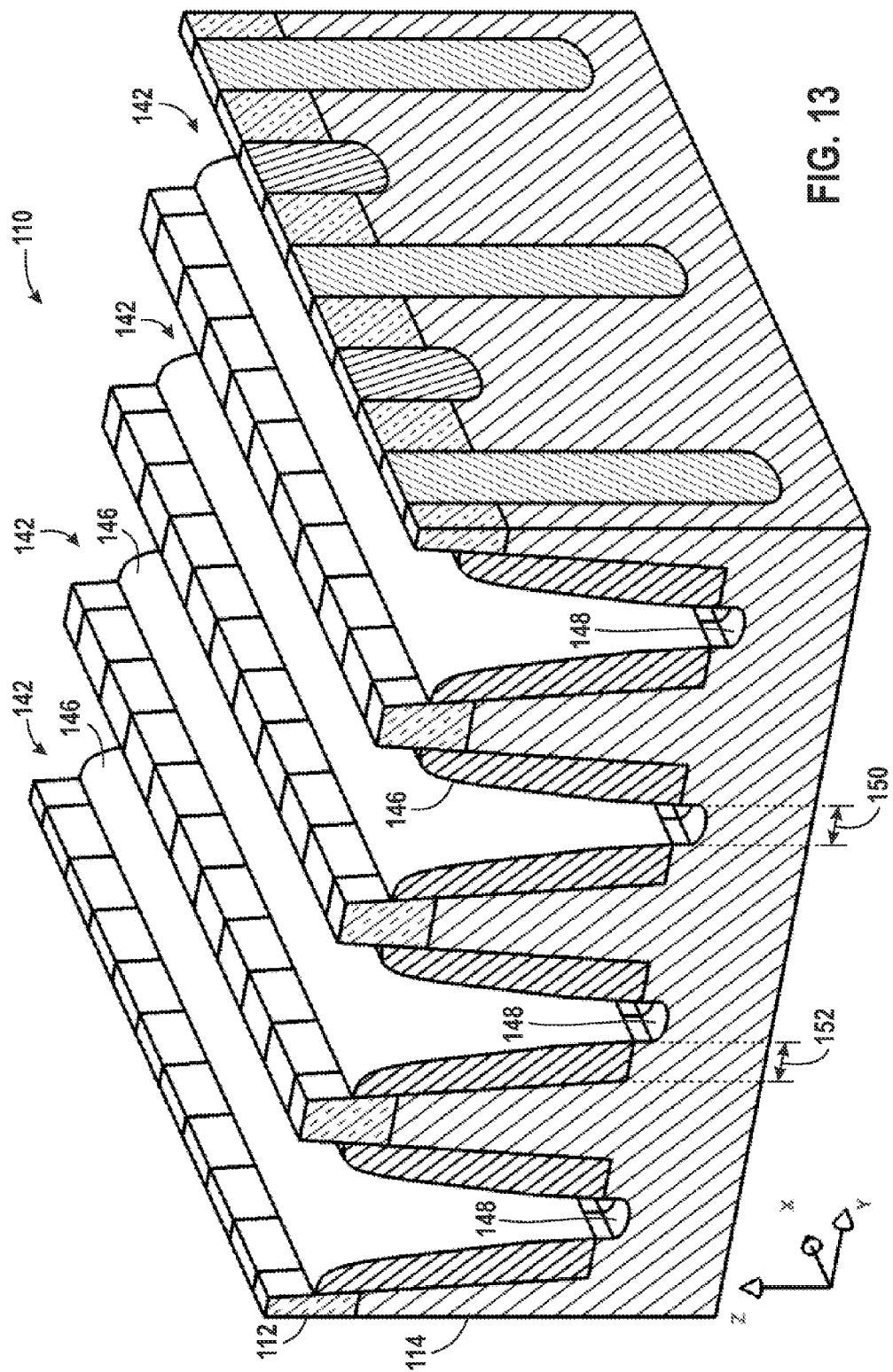
Figure 14:
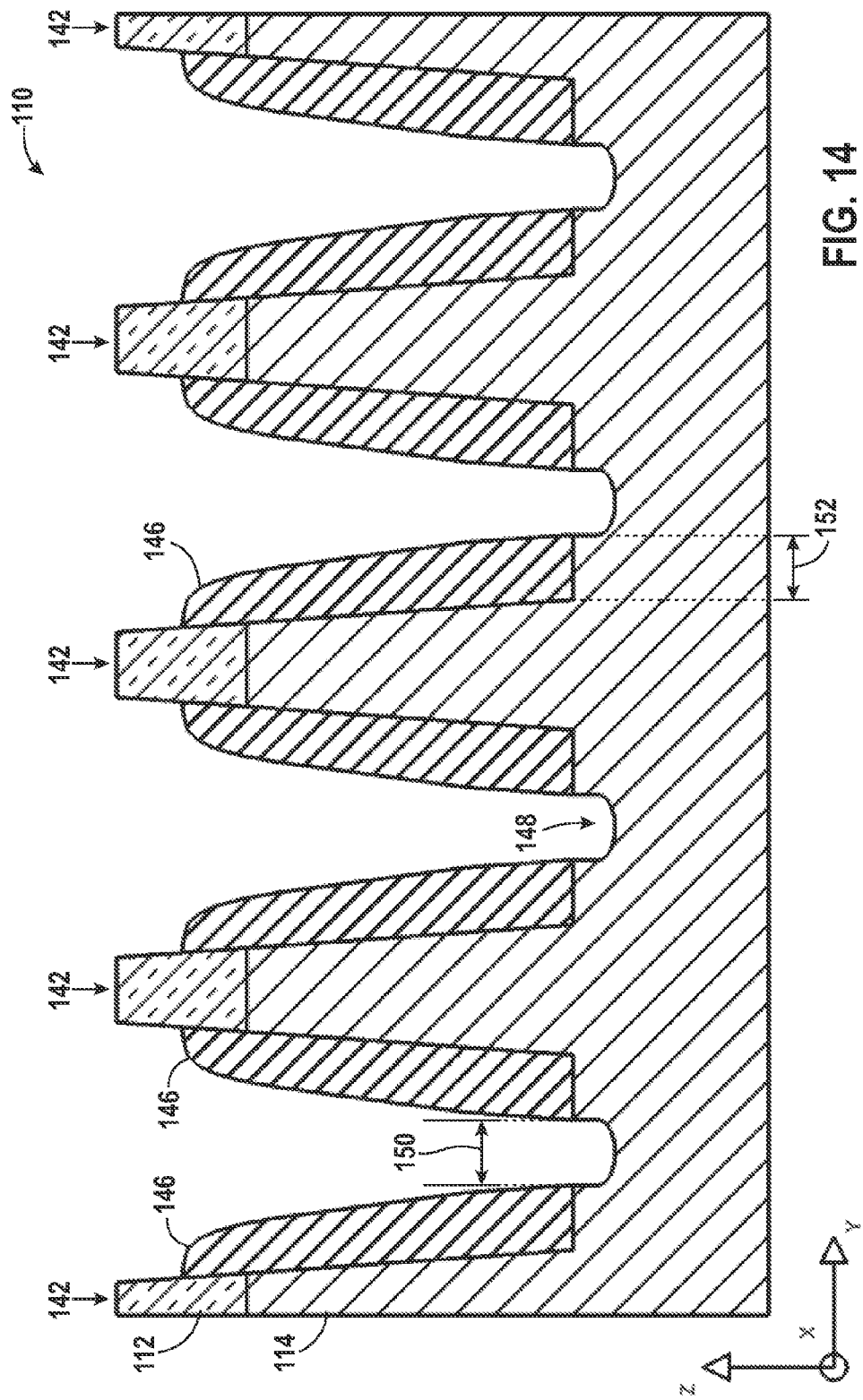

FIGS. 13 and 14 illustrate a sacrificial material 146 (which in this embodiment functions as, and may be referred to as a mold) that may be formed against the sidewalls of the fin rows 142. The sacrificial material 142 may be formed with a sidewall spacer process. Sacrificial material 142 may be formed from a material that may become flowable (e.g., it may become a fluid, such as a gas or a liquid) under procession conductions subsequently described with reference to FIG. 18. Examples of disposable-mold materials include carbon and certain polymers, both of which may be removed from the substrate 110 as a gas by reacting them with oxygen in a furnace. A conformal film may be deposited on the substrate 110, covering the upper doped region 112 and the lower doped region 114, and subsequently is anisotropically etched. The sidewall spacer etch may remove a portion of the lower doped region 114 to form recesses 148. The recesses 148 may have a width 150 generally equal to or less than 1 F, ½ F, or ¼ F. As explained below, continuing the sidewall spacer etch until it forms recesses 148 is believed to reduce the likelihood of gates formed with the molds 146 shorting to one another. In this embodiment, the sacrificial material 146 extends above the bottom of the upper doped region 112 and has a width 152 that may be less than or generally equal to 1 F, ½ F, or ¼ F.

Figure 15:
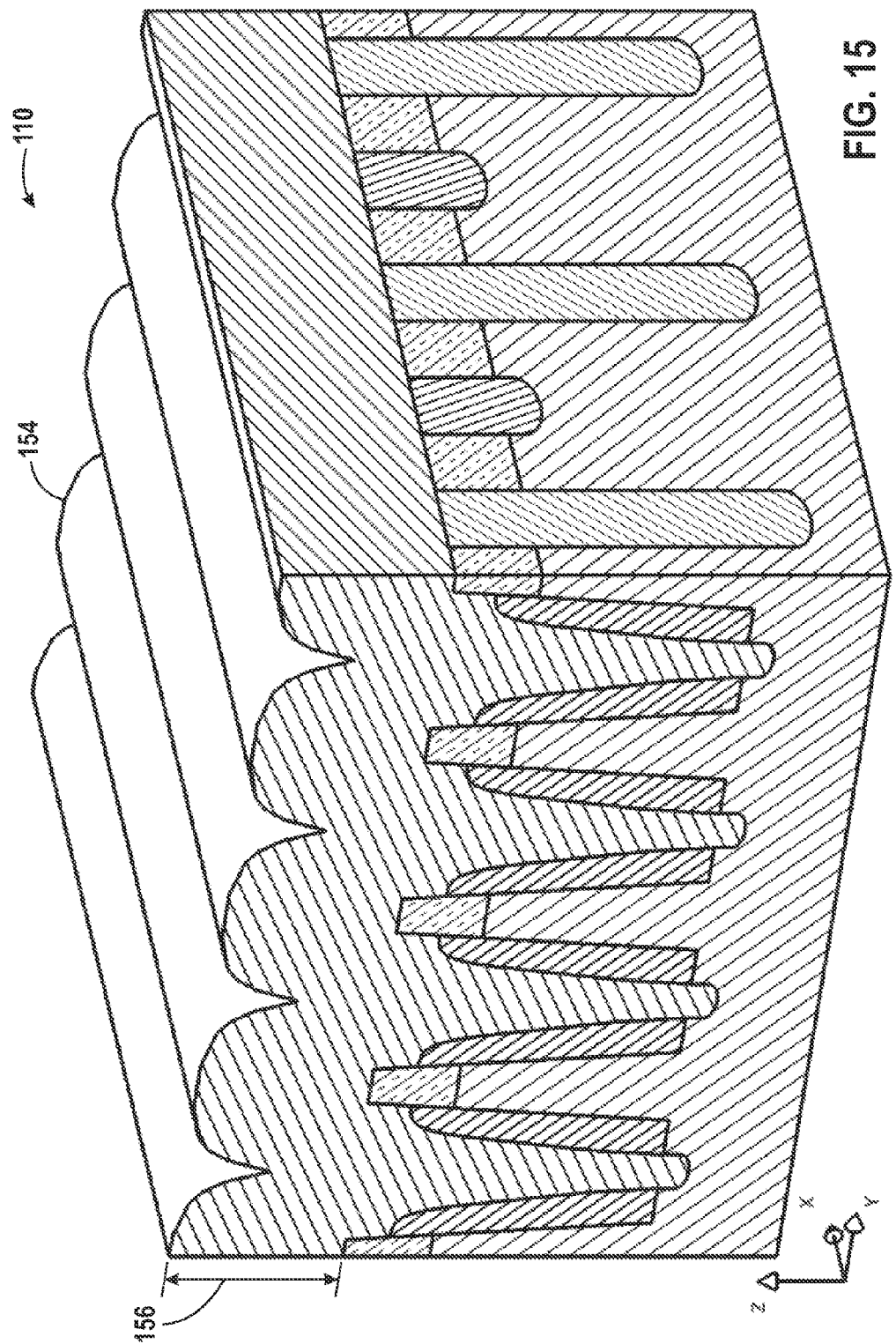

After forming the sacrificial material 146, a dielectric region 154 may be formed over the sacrificial material 146, as illustrated by FIG. 15. In some embodiments, the dielectric region 154 may be an oxide deposited with a low-temperature process, such as atomic-layer-deposition (ALD). The illustrated dielectric 154 substantially or entirely envelops the sacrificial material 146 and includes an overburden 156.

Figure 16:
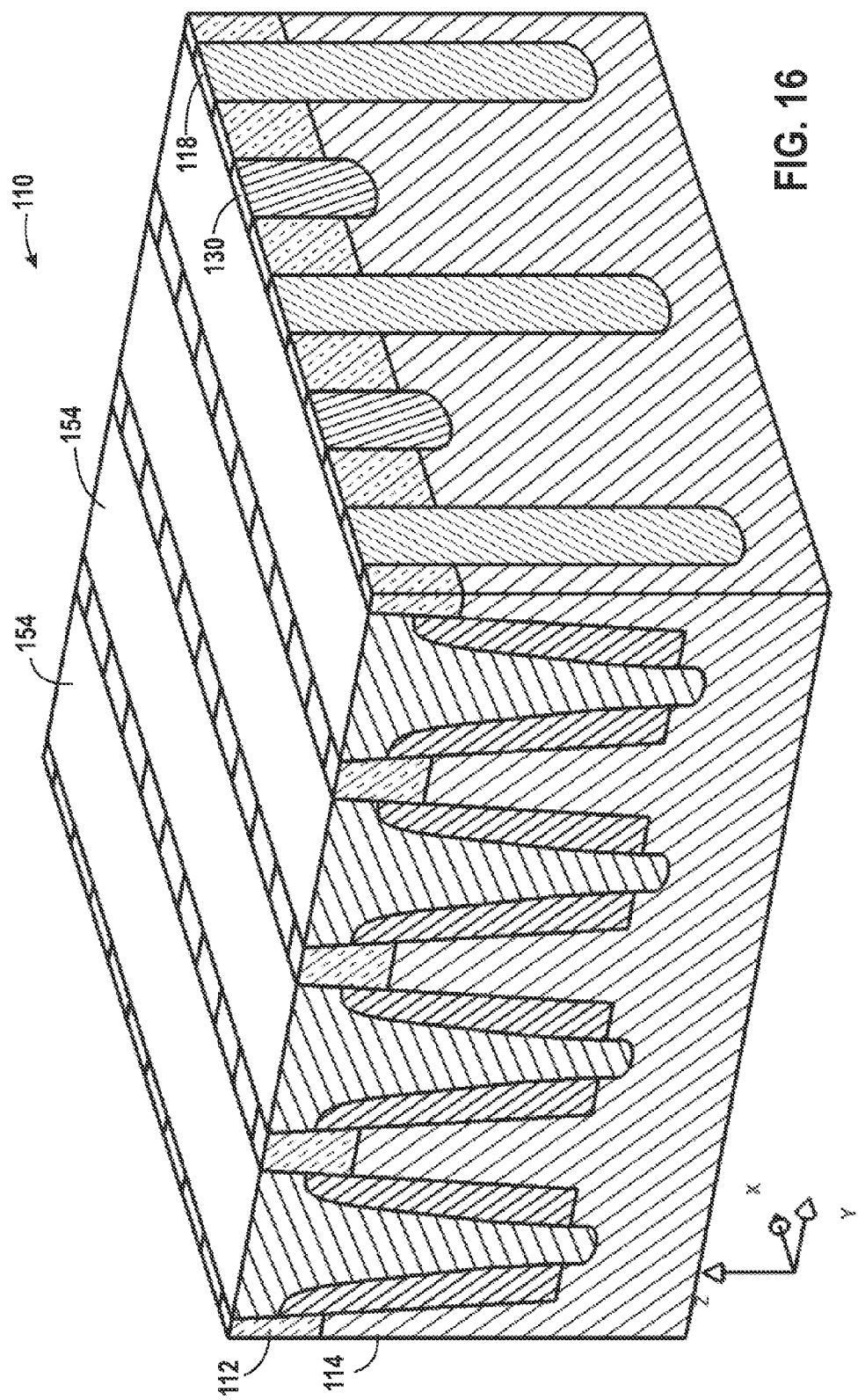

The overburden 156 is consumed in a planarization step illustrated by FIG. 16. The substrate 110 may be planarized with an etch back, CMP, or other processes. In some embodiments, the overburden 156 may be removed until the top of the upper doped region 112, the deep isolation trench 118, and the shallow trenches 130 are exposed. The transition between the dielectric region 154 and these structures 112, 118, and 130 may produce a phenomenon that triggers an endpoint to the process used to planarize the substrate 110. For example, this transition may yield a change in the optical properties of the substrate 110 (such as color), a change in the chemical properties of waste material leaving the substrate 110 (such as waste gases in an etch chamber or slurry pH), or a change in the mechanical properties of the substrate 110 (such as sliding friction).

Figure 17:
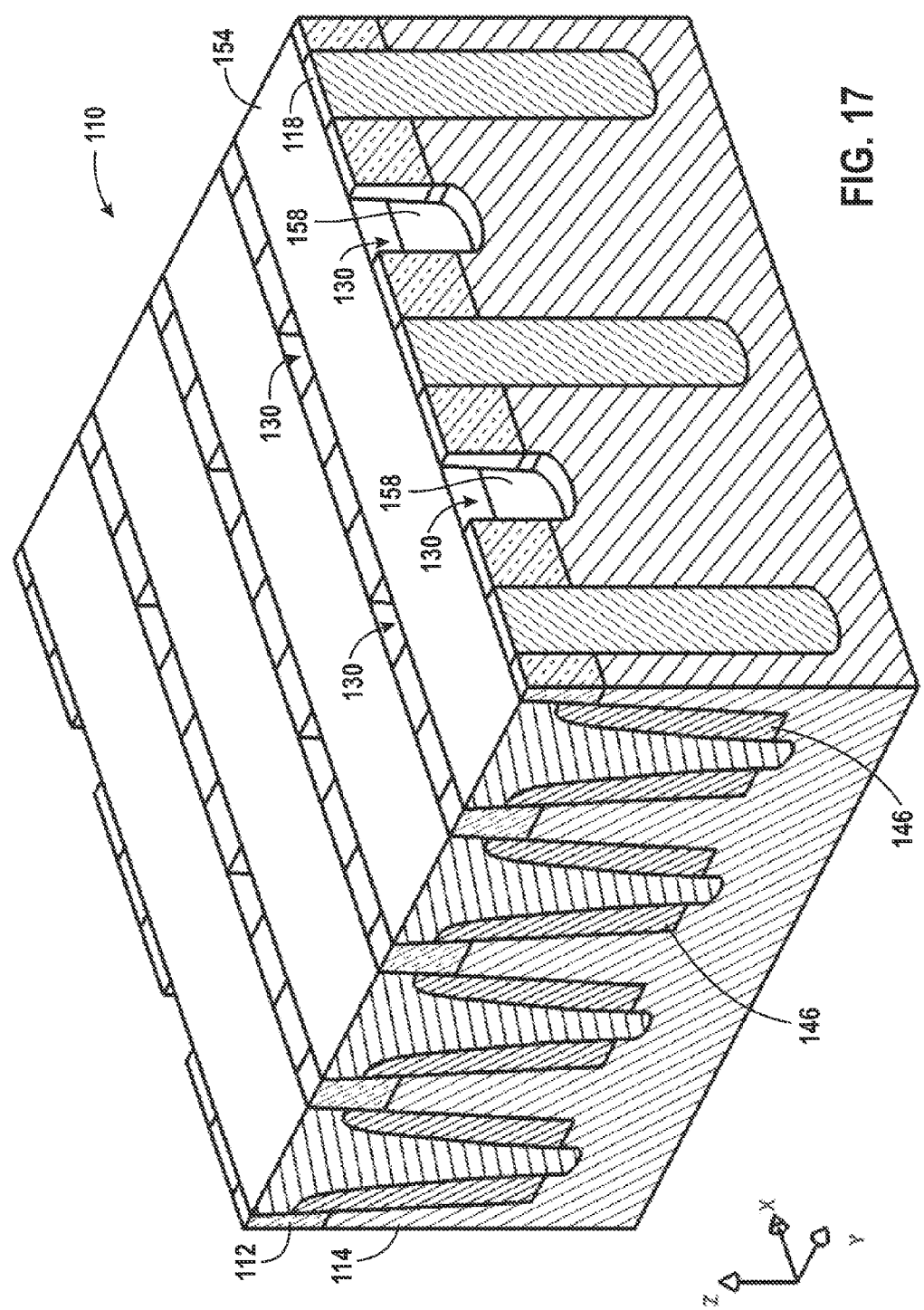

Next, at least a portion of the material in the shallow trenches 130 may be removed, as illustrated by FIG. 17. In some embodiments, this material is a nitride, and it is removed with a dry etch that is selective against silicon and oxide to avoid losing substantial amounts of these materials. Clearing at least a portion of the shallow trenches 130 opens a passage to a sidewall 158 of the sacrificial material 146, and this passage may facilitate removal of the sacrificial material 146.

Figure 18:
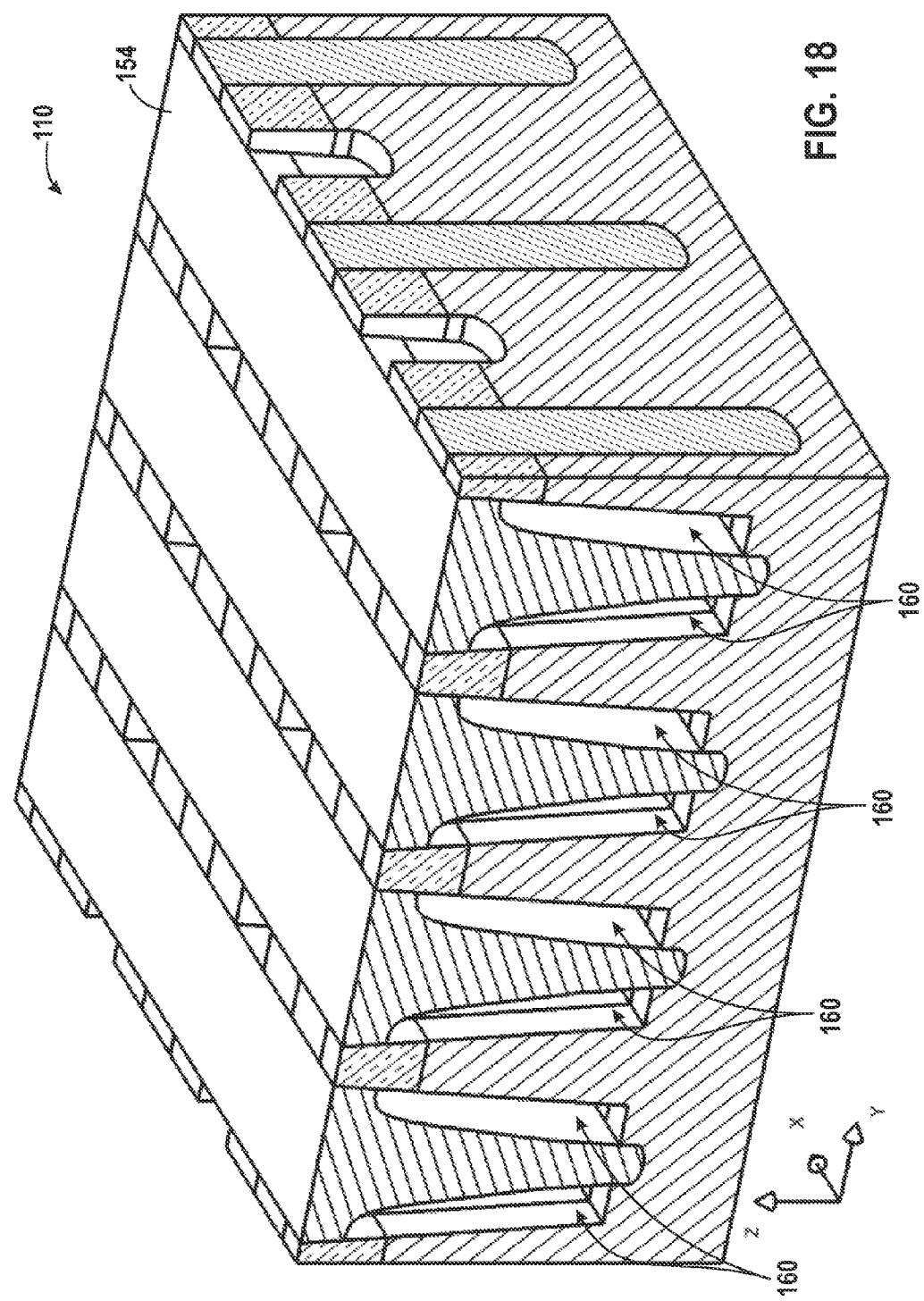

The sacrificial material 146 may be removed by way of the open passage through the shallow isolation trench 130, as illustrated by FIG. 18. To remove the sacrificial material 146, the substrate 110 may be exposed to an oxygen plasma, e.g., in a plasma etch chamber, or oxygen in a furnace. The plasma or other reactants flow in through the shallow isolation trench 130 and react with the sidewall 158 of the sacrificial material 146, e.g., by combusting the sacrificial material 146. In some embodiments, the byproducts of the reaction are gases, e.g. steam, carbon monoxide, and carbon dioxide, and the gases flow back out through the shallow isolation trench 130. In some embodiments, combustion continues until a substantial portion or substantially the entire sacrificial material 146 is burned and cavities 160 are formed. The resulting cavities 160 are bounded on one side by the dielectric 154 and on another side by the fin rows 142.

Figure 19:
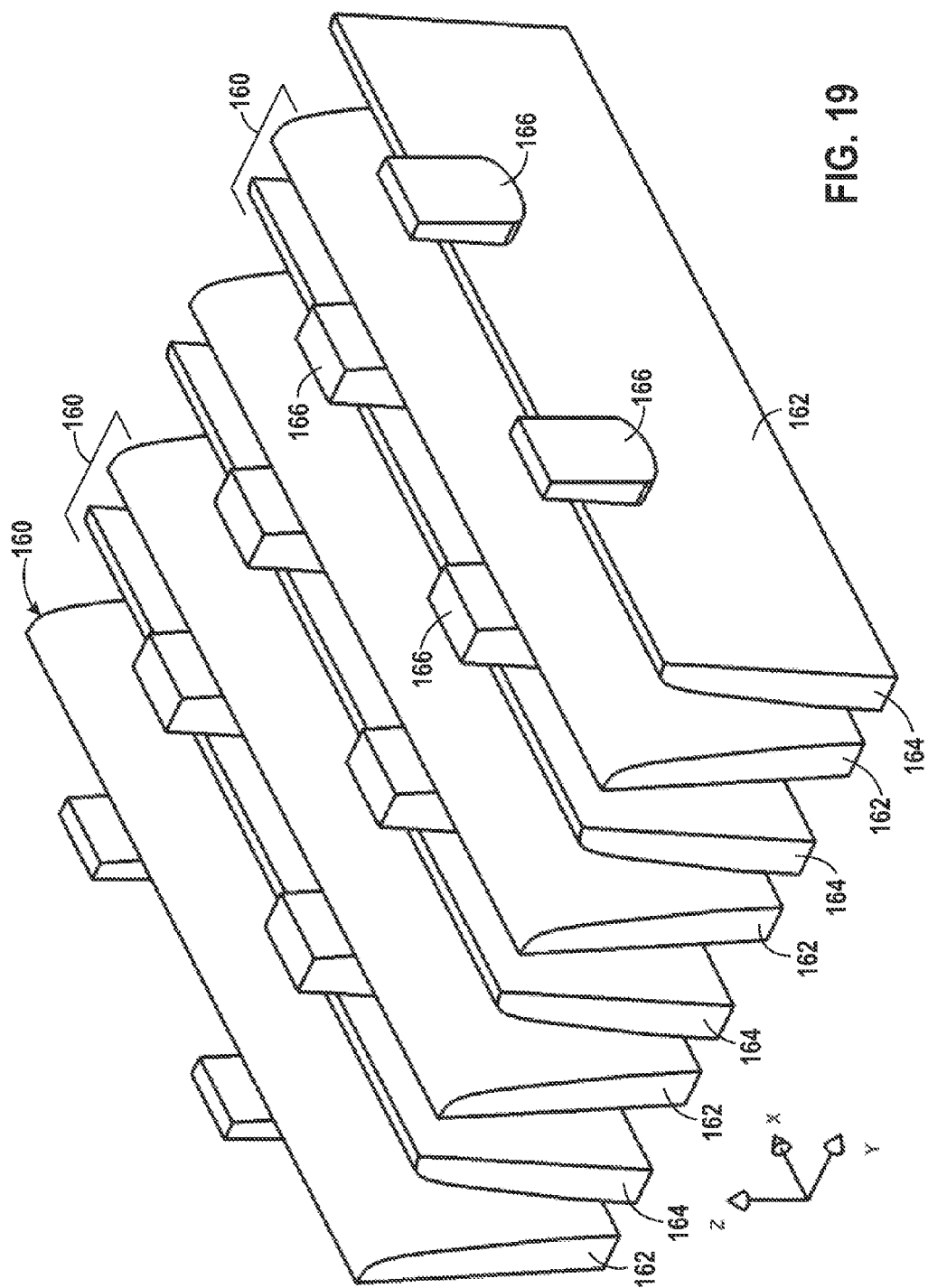

The shape of the cavities 160 is illustrated by FIG. 19, which illustrates cavities 160 without the other parts of substrate 110. Each of the cavities 160 may includes two generally reflectively symmetric, generally linear, and generally parallel voids 162 and 164 and a plurality of trench segments 166. The illustrated trench segments 166 are disposed in a top portion of the voids 162 and 164 and join the voids 162 and 164 to one another. Adjacent cavities 160 may be substantially or entirely separated from one another by the dielectric 154 (FIG. 18).

Figure 20:
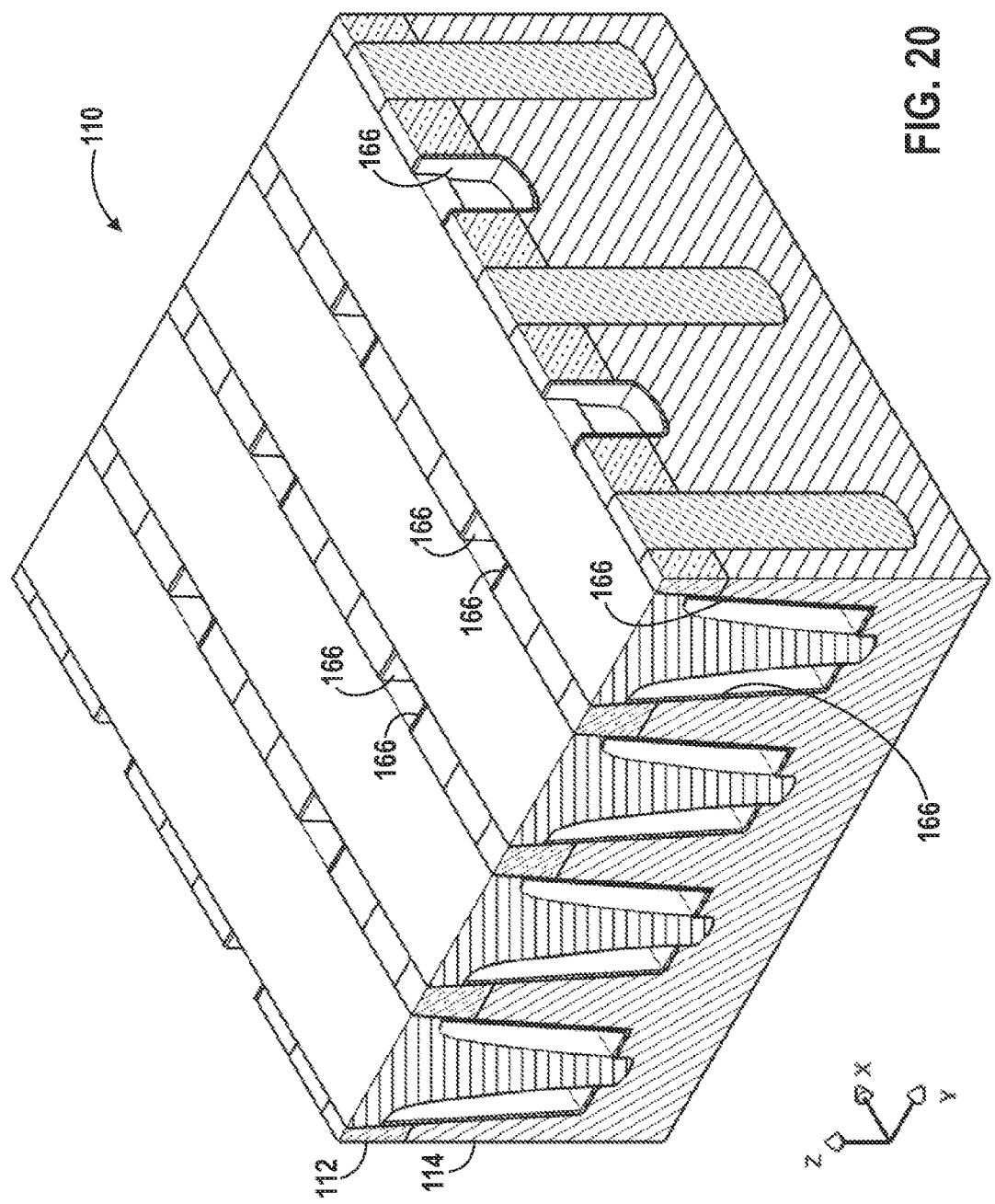

Next, a gate dielectric 166 may be formed within the cavities 160, as illustrated by FIG. 20. The gate dielectric 166 may be either deposited, e.g., with CVD, or grown by exposing the substrate 110 to oxygen. In the illustrated embodiment, the gate dielectric 166 is grown by reacting silicon portions of the substrate 110 with oxygen, so the gate dielectric 166 is disposed on the exposed surfaces of the fin rows 142, including the surface of the shallow trench 130. The oxygen or other chemicals that react to form the gate dielectric 166 flow into the cavities 160 through the trench segments 166 and reacts with surfaces within the linear voids 162 and 164 (FIG. 19). In various embodiments, the gate dielectric 166 may be made from a variety of materials, including oxide, oxynitride, a hafnium-based high-k dielectric, or other appropriate materials.

Figure 21:
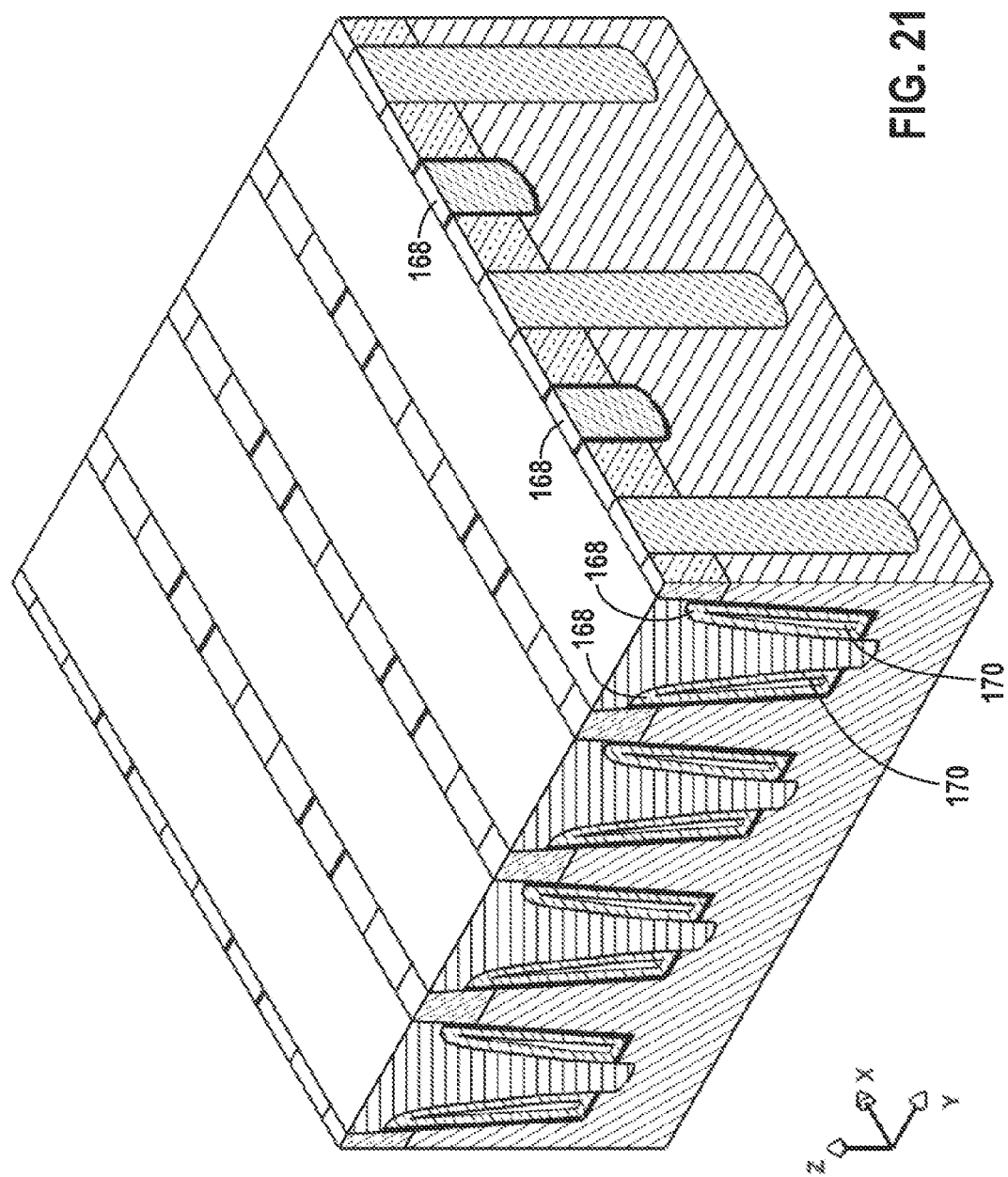
Figure 22:
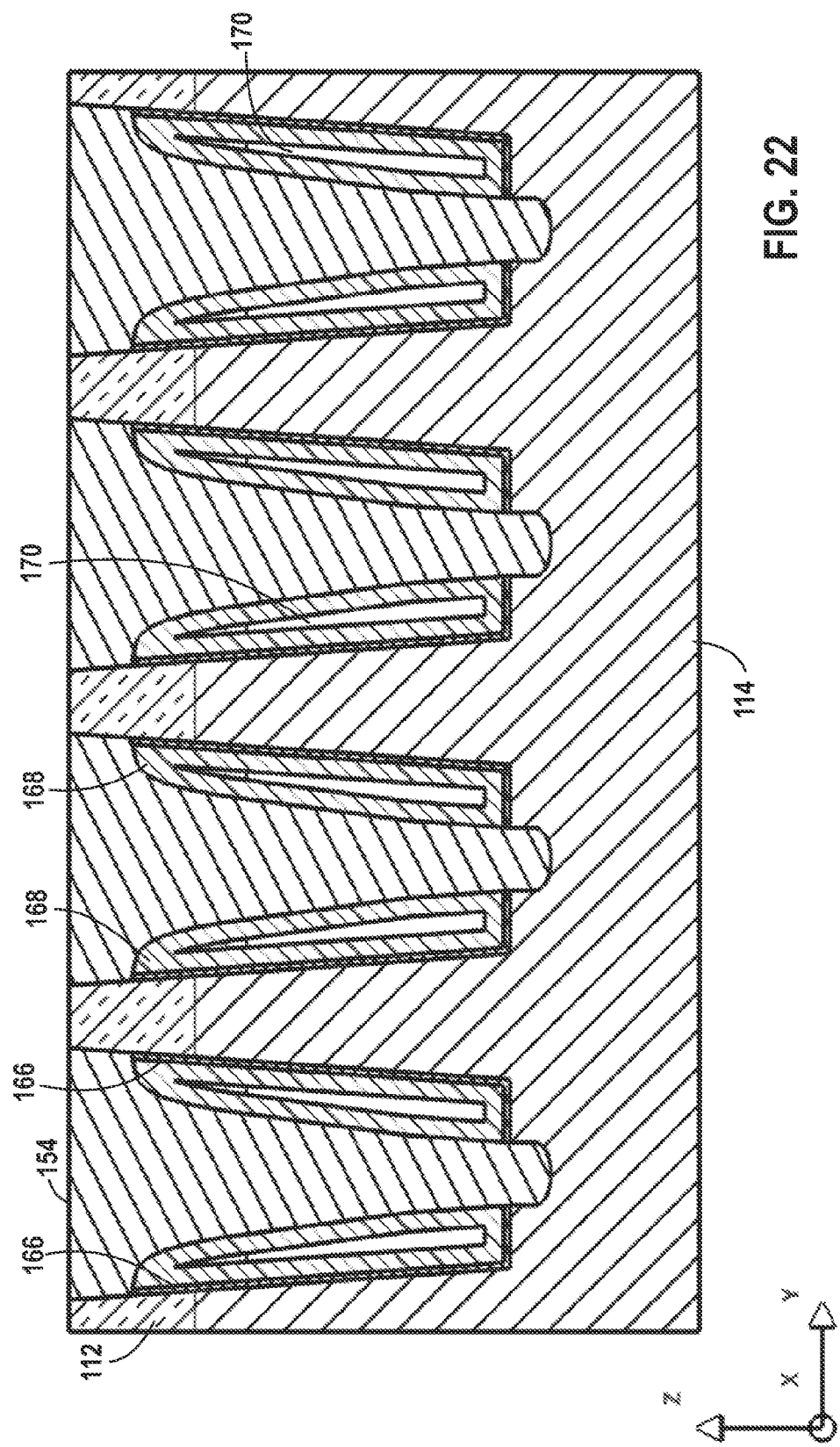
Figure 23:
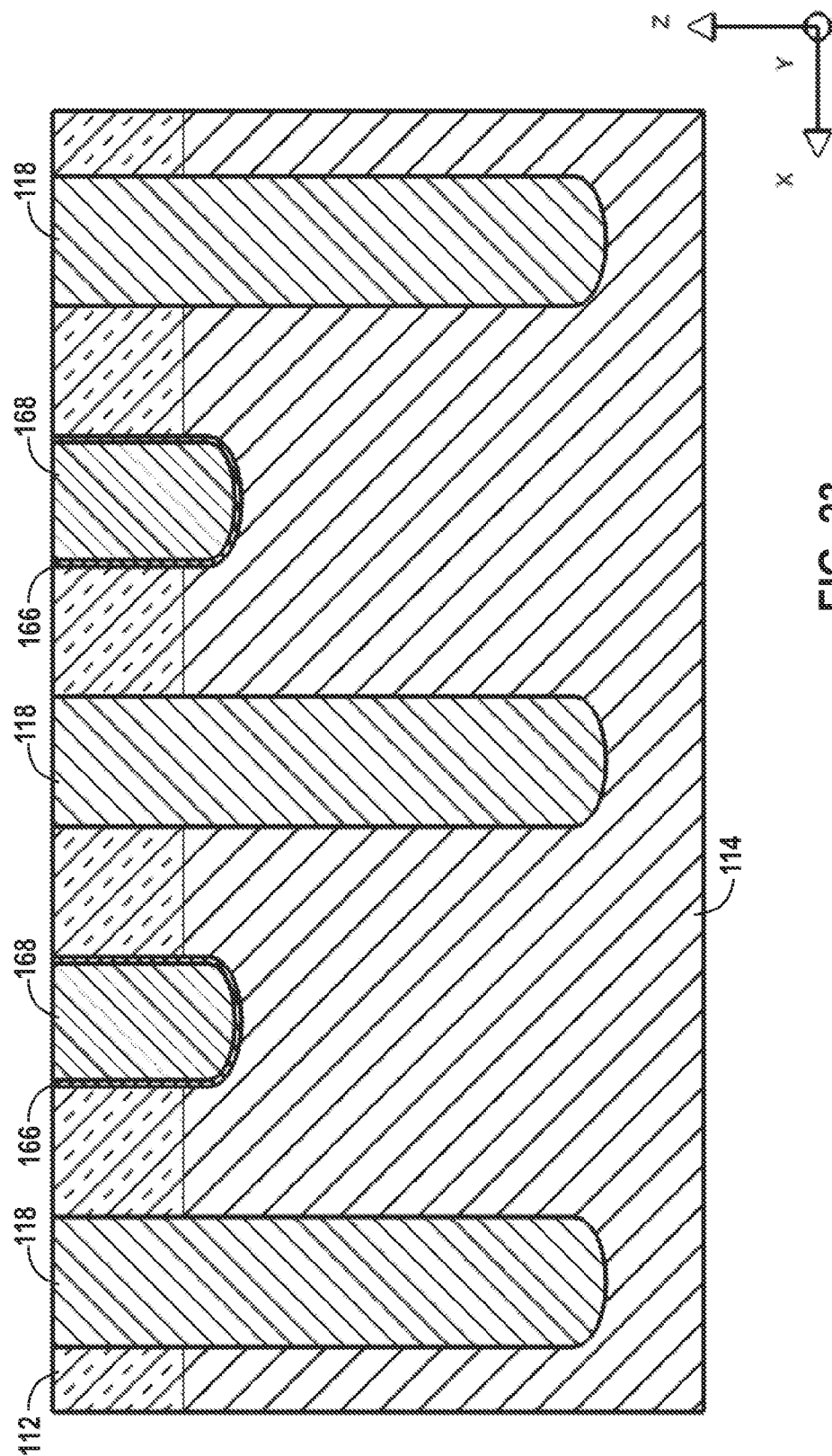

Once the gate dielectric 166 is formed, gate material may be deposited within the cavities 166 to form gates 168, as illustrated by FIGS. 21, 22 and 23. The illustrated gates 168 may be formed by depositing titanium nitride or other appropriate conductive materials. The gate material may be conveyed to the substrate 110 and into the cavities 166 by gas-phase reactants. The reactants may flow into the cavities 166 through the shallow trench 130 and react on the surface of the cavities 166. In some embodiments, the gate material closes the shallow trench 130 before the cavities 166 are filled, thereby leaving voids 170. An overburden of gate material may form on the surface of the substrate 110, and the overburden may be removed with a wet etch, a dry etch, or a CMP process.

FIG. 24 is an exploded, perspective view of an example of a transistor 171 formed with the above-described process. It should be noted, though, that the present technique is not limited to transistors and may be used to form other devices, such as capacitors or floating-gate transistors. The illustrated transistor 171 includes a fin 172, the gate dielectric 166, and the gate 168. The illustrated fin 172 includes two legs 174 and 176 separated by a generally U-shaped slot 178 corresponding with the shallow trench 130. A distal portion of the fin 172 is made from the upper doped region 112, and a lower portion of the fin 172 is made from the lower doped region 114. Edges 180 and 182 are generally defined by the deep isolation trenches 118 and may be longer than sides 184 and 185 of the fin 172. The illustrated gate 166 is disposed adjacent both the sides 184 and 185 and the surface of the slot 178.

In the illustrated embodiment, the gate 168 includes two side gates 186 and 188 and a top gate 190. The two side gates 186 and 188 are generally reflectively symmetric and both generally extend in the X direction with a generally uniform cross-section over a substantial distance. The shape of the side gates 186 and 188 is generally complementary to the shape of the sacrificial material 146 with the exception of the voids 170. The illustrated top gate 190 has a generally uniform cross-section in the Y direction and it joins the side gates 186 and 188 to one another. The top gate 190 may be generally solid, without a void, or in some embodiments, the top gate 190 may also include a void. The side gate 186 is disposed at least partially adjacent the side 185 of the fin 172, the top gate 190 is disposed at least partially within the slot 178, and the side gate 188 is disposed at least partially adjacent the side 184 of the fin 172. The illustrated transistor 171 may be characterized as a tri-gate transistor, because the gate 168 is disposed adjacent two sides and a top portion of the fin 172.

In operation, the two legs 174 and 176 may function as a source and a drain, and the transistor 171 may selectively control the flow of current between the source and the drain according to a voltage of the gate 168. The illustrated transistor 171 includes three channels: a generally horizontal channel represented by arrows 192 and two generally vertical channels represented by arrows 194. The generally horizontal channel 192 may be established by electric fields emanating from the top gate 190, and the generally vertical channels 194 may be established by electric fields emanating from the two side gates 186 and 188.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A transistor comprising:
   a fin;
   a first hollow gate formed on a first side of the fin; and
   a second hollow gate formed on a second side of the fin, opposite the first side, wherein the first hollow gate and the second hollow gate are formed along an entire length of the fin.

2. The transistor of claim 1, wherein the fin comprises a slot formed in a distal portion of the fin.

3. The transistor of claim 2, comprising a top gate, wherein at least a portion of the top gate is formed within the slot.

4. The transistor of claim 1, wherein the fin comprises an upper doped region formed at a distal portion of the fin and a lower doped region formed below the upper doped region.

5. The transistor of claim 4, comprising a source and a drain formed in the upper doped region of the fin.

6. The transistor of claim 1, comprising:
   a first gate dielectric formed on the first side of the fin between the fin and the first hollow gate; and
   a second gate dielectric formed on the second side of the fin between the fin and the second hollow gate.

7. The transistor of claim 1, wherein the fin comprises a first leg and a second leg.

8. The transistor of claim 7, wherein the first leg comprises a source and the second leg comprises a drain.

9. A transistor comprising:
   a hollow top gate;
   a first hollow side gate electrically coupled to a first side of the hollow top gate; and
   a second hollow side gate electrically coupled to a second side of the hollow top gate, opposite the first side.

10. The transistor of claim 9, wherein the transistor comprises a fin field-effect transistor.

11. The transistor of claim 9, comprising a fin, wherein the first hollow side gate is formed on a first side of the fin and the second hollow side gate is formed on a second side of the fin.

12. The transistor of claim 9, comprising a fin, wherein the top gate is formed within a top portion of the fin.

13. The transistor of claim 9, comprising three channels.

14. The transistor of claim 13, wherein a first of the three channels is horizontal and a second of the three channels is vertical.

15. A transistor comprising:
   a fin having a source and a drain formed at an upper portion of the fin; and
   a plurality of gates adjacent to the fin, wherein at least one of the plurality of gates is hollow, and wherein the plurality of gates comprise:
      a first side gate formed on a first side of the fin;
      a second side gate formed on a second side of the fin, opposite the first side, wherein each of the source and the drain are formed in between the first side gate and the second side gate; and
      a top gate formed between the source and the drain, wherein the top gate is shorter in length in a direction from the source to the drain compared to the first side gate and the second side gate.

16. The transistor of claim 15, wherein the first side gate is hollow.

17. The transistor of claim 15, wherein the top gate is hollow.

18. The transistor of claim 15, wherein the fin comprises three channels.

19. The transistor of claim 15, wherein the first side gate is electrically coupled to a first side of the top gate and the second side gate is electrically coupled to a second side of the top gate, opposite the first side.

20. The transistor of claim 15, wherein the fin comprises a slot and wherein at least a portion of the top gate is formed within the slot.

21. The transistor of claim 15, wherein the fin comprises two legs.

22. The transistor of claim 21, wherein a first of the two legs comprises the source, and a second of the two legs comprises the drain.

* * * * *